United States Patent
Chuang et al.

(10) Patent No.: US 11,664,278 B2
(45) Date of Patent: May 30, 2023

(54) SEMICONDUCTOR DEVICE WITH L-SHAPE CONDUCTIVE FEATURE AND METHODS OF FORMING THE SAME

(71) Applicant: Taiwan Semiconductor Manufacturing Co., Ltd., Hsin-Chu (TW)

(72) Inventors: Cheng-Chi Chuang, New Taipei (TW); Li-Zhen Yu, Hsinchu (TW); Yi-Hsun Chiu, Hsinchu County (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 114 days.

(21) Appl. No.: 16/935,830

(22) Filed: Jul. 22, 2020

(65) Prior Publication Data

US 2022/0028743 A1    Jan. 27, 2022

(51) Int. Cl.
*H01L 21/8234* (2006.01)
*H01L 29/66* (2006.01)
*H01L 29/78* (2006.01)
*H01L 21/768* (2006.01)

(52) U.S. Cl.
CPC ......... *H01L 21/823431* (2013.01); *H01L 21/76816* (2013.01); *H01L 21/823437* (2013.01); *H01L 29/66795* (2013.01); *H01L 29/785* (2013.01)

(58) Field of Classification Search
CPC ..... H01L 21/823431; H01L 21/823437; H01L 21/768; H01L 21/76802; H01L 21/76814; H01L 21/76816; H01L 21/76883; H01L 29/66795; H01L 23/481; H01L 23/528; H01L 23/535
See application file for complete search history.

(56) References Cited

U.S. PATENT DOCUMENTS

| | | |
|---|---|---|
| 8,772,109 B2 | 7/2014 | Colinge et al. |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw et al. |
| 9,520,482 B1 | 12/2016 | Chang et al. |
| 9,576,814 B2 | 2/2017 | Wu et al. |

(Continued)

*Primary Examiner* — Tuan A Hoang
(74) *Attorney, Agent, or Firm* — Haynes and Boone, LLP

(57) ABSTRACT

Semiconductor device and the manufacturing method thereof are disclosed herein. An exemplary semiconductor device comprises a semiconductor fin disposed over a substrate; a metal gate structure disposed over a channel region of the semiconductor fin; a first interlayer dielectric (ILD) layer disposed over a source/drain (S/D) region next to the channel region of the semiconductor fin; and a first conductive feature including a first conductive portion disposed on the metal gate structure and a second conductive portion disposed on the first ILD layer, wherein a top surface of the first conductive portion is below a top surface of the second conductive portion, a first sidewall of the first conductive portion connects a lower portion of a first sidewall of the second conductive portion.

20 Claims, 18 Drawing Sheets

(56) References Cited

U.S. PATENT DOCUMENTS

| | | | | |
|---|---|---|---|---|
| 2002/0014648 A1* | 2/2002 | Mizutani | ............ | H01L 21/76838 |
| | | | | 257/E21.507 |
| 2017/0141037 A1* | 5/2017 | Wu | ................. | H01L 21/823431 |
| 2019/0130956 A1* | 5/2019 | Müller | ................ | H01L 27/1159 |
| 2020/0035683 A1* | 1/2020 | Sharma | ............... | H01L 25/0657 |
| 2020/0083094 A1* | 3/2020 | Ding | ................. | H01L 21/76871 |

* cited by examiner

SEMICONDUCTOR DEVICE WITH L-SHAPE CONDUCTIVE FEATURE AND METHODS OF FORMING THE SAME

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, it has been observed that in a conventional continuous gate via scheme, the pitch size of metal line over the gate vias (i.e. the minimum center-to-center distance between the metal lines) is constrained by the dielectric cut ending between the metal lines. Due to the processing limitation, some of the metal lines may be very short, or some other metal lines have to be shifted away from the gate via landed below. These may cause high resistance or open issues. Thus, the reliability and the performance of the semiconductor device may be degraded. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
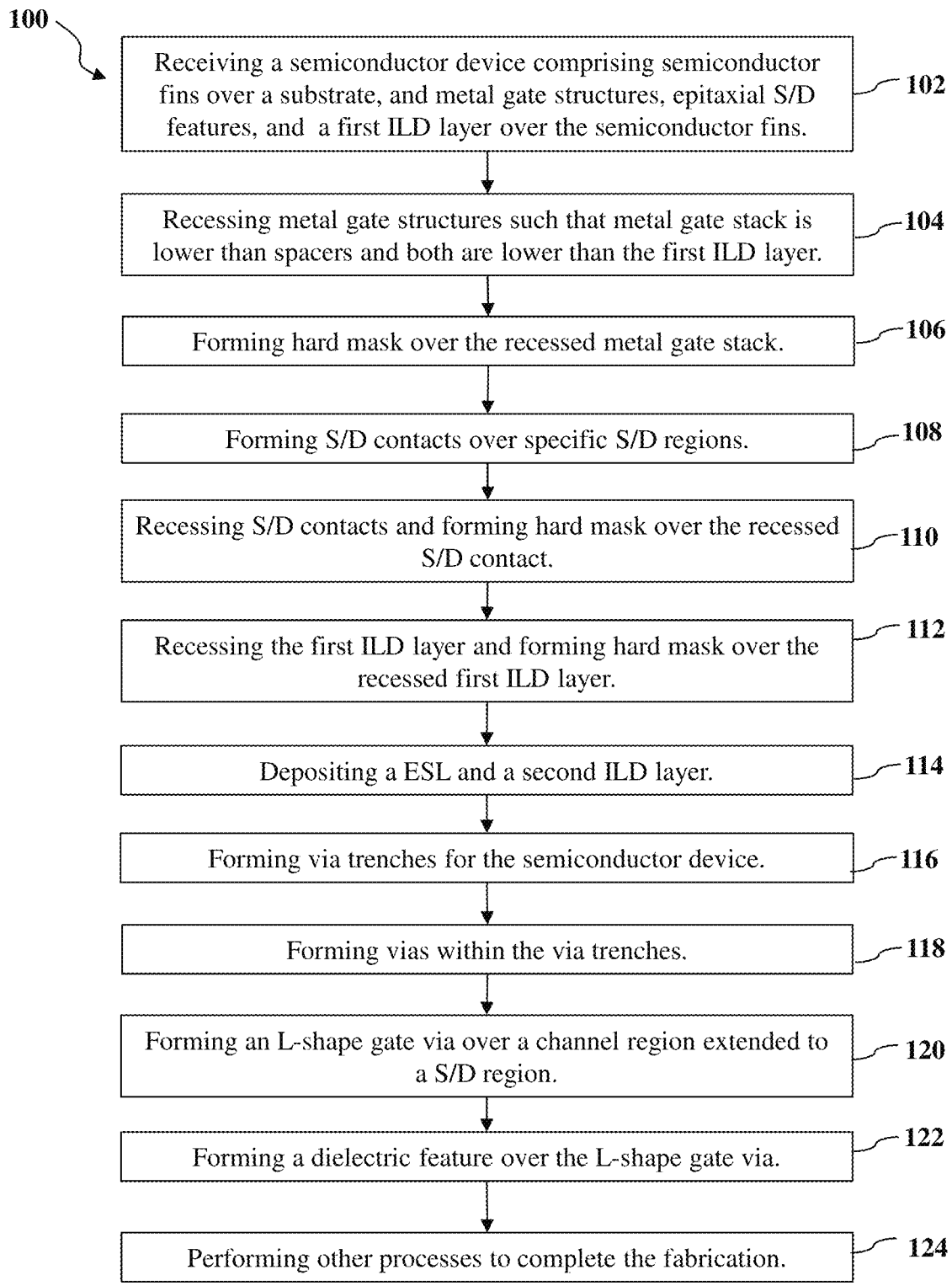
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof. Due to the scaling down of the semiconductor device, the geometry size between different components of the semiconductor device is getting smaller and smaller which may cause some issues and degrade the performance of the semiconductor device. For example, in a conventional fabrication of a continuous gate via layout, some of the metal lines may be very short due to the pitch size constraint of the continuous gate via scheme. Or, some of the metal lines may be shift away from the gate vias landed below them. The short metal lines may cause risk of high resistance, the shift away metal line may cause open issue. Thus, the layout density is lowered, and the time dependent dielectric breakdown (TDDB) and the reliability of the semiconductor device are reduced.

The present disclosure provides an L-shape gate via scheme to extend the gate via contact path for a half pitch, thereby can enlarge the metal line size, reduce the resistance, and mitigate the open issue. In the present disclosure, slot type etching and metal etching back processes are used to form the L-shape gate via. A dielectric feature (i.e. a hard mask) is formed over the removed corner of the L-shape gate via to improve the isolation between the gate via and the adjacent metal line. Therefore, the layout density is increased, the TDDB and the reliability of the semiconductor device can be improved. Of course, these advantages are merely exemplary, and no particular advantage is required for any particular embodiment.

Figure 2:
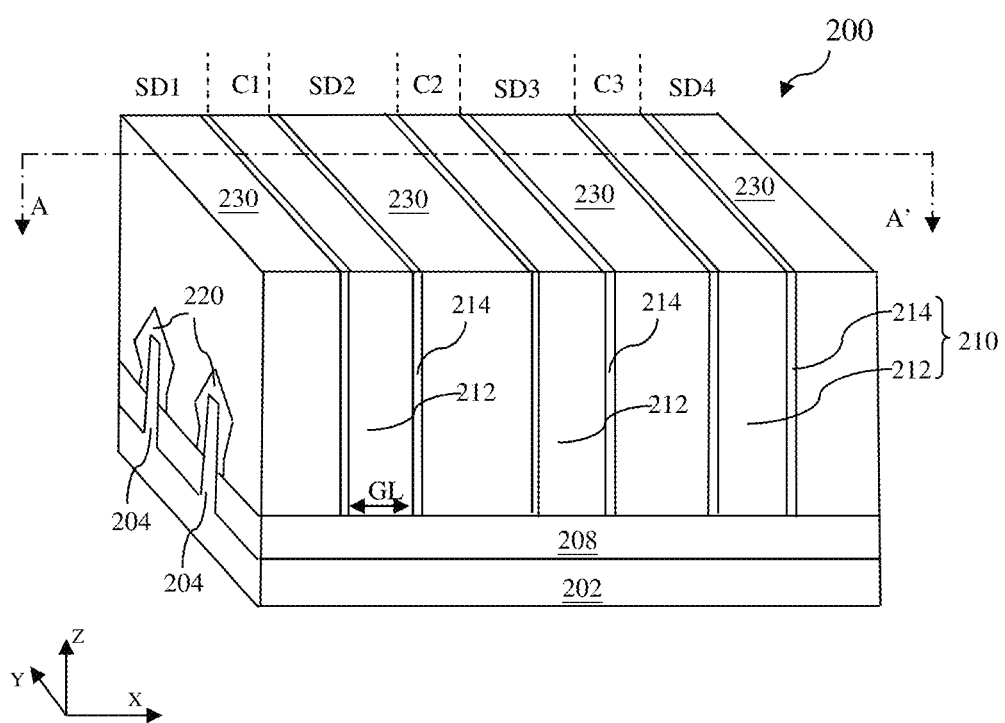
FIG. 2 illustrates a three-dimensional perspective view of an example semiconductor device in accordance with some embodiments of the present disclosure.

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIG. 2 illustrates a three-dimensional view of device 200. FIGS. 3-29, 30A, 30B, and 31-33 illustrate cross-sectional views of device 200 taken along plane A-A' shown in FIG. 2 (that is, along an X-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices.

Figure 3:
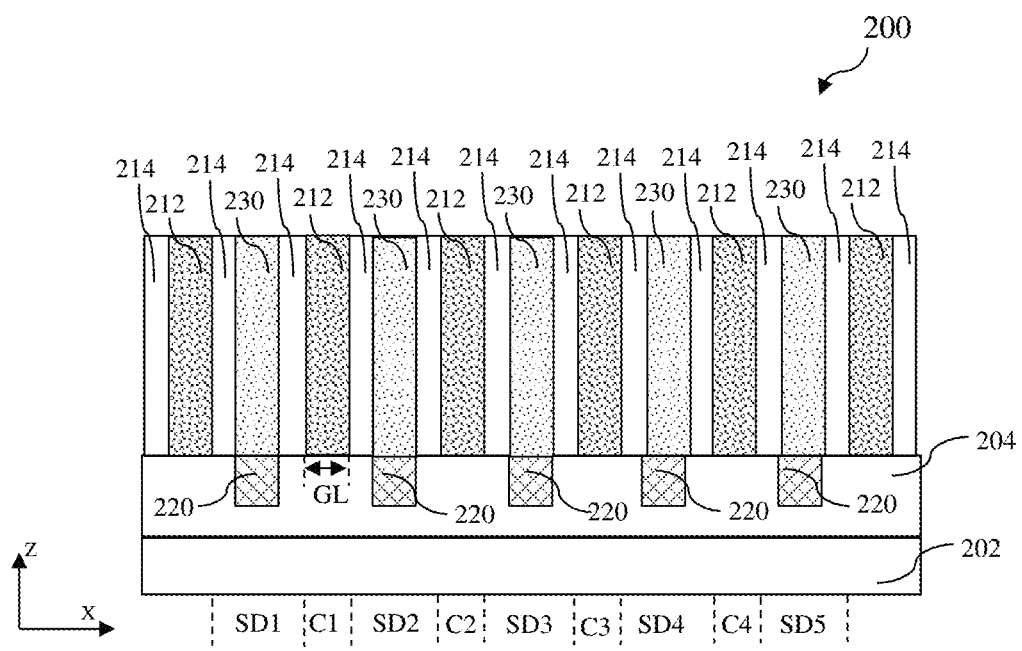
FIGS. 3-29, 30A, 30B, and 31-33 illustrate cross-sectional views along plane A-A' shown in FIG. 2 of the example semiconductor device at intermediate stages of the method of FIG. 1 in accordance with some embodiments of the present disclosure.

Referring to FIGS. 1 and 2, at operation 102, method 100 provides a device 200 comprising one or more semiconductor fins 204 (hereinafter fins 204) and one or more gate structures 210 disposed over a substrate 202. Fins 204 protruding from substrate 202 and separated by an isolation structure 208. Gate structures 210 disposed over substrate 202 and fins 204. Gate structures 210 define channel regions (such as C1, C2, C3), source regions and drain regions (such as SD1, SD2, SD3, SD4, all referred to as source/drain (S/D) regions) of fins 204. Gate structures 210 may include metal gate stacks 212 and gate spacers 214 disposed along sidewalls of metal gate stacks 212. Each metal gate stack 212 may include a metal gate electrode, a gate dielectric layer between the metal gate electrode and fins 204, and a hard mask layer over the metal gate electrode. In some embodiments, each metal gate stack 212 may include one or more of a barrier layer, a glue layer, a capping layer, other suitable layers, or combinations thereof. Each metal gate stack 212 has a gate length GL in the X-direction, which defines the channel length of device 200. Device 200 may also include S/D features 220 epitaxially grown over S/D regions of fins 204. Device 200 may also include interlayer dielectric (ILD) layer 230 disposed over substrate 202 and fins 204, and between gate structures 210. It is understood components included in device 200 are not limited to the numbers and configurations as shown in FIG. 2. More or less components, for example, more or less fins and gate structures, may be included in device 200. In some other embodiments, device 200 may be a metal-oxide-semiconductor field-effect transistor (MOSFET) device without fin structures. FIG. 3 illustrate a cross-sectional view along plane A-A' shown in FIG. 2 of device 200 (that is, along the X-direction).

In the depicted embodiment, substrate 202 is a bulk substrate that includes silicon. Alternatively or additionally, the bulk substrate includes another elementary semiconductor, a compound semiconductor, an alloy semiconductor, or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. In some embodiments, substrate 202 may include n-type or p-type doped regions.

Semiconductor fins 204 are formed over substrate 202. Each fin 204 may be suitable for providing an n-type FET or a p-type FET. Fins 204 are oriented substantially parallel to one another, for example, in the X-direction. Each of fins 204 has at least one channel region and at least one S/D region defined along their length in the X-direction, where the at least one channel region is covered by gate structures and is disposed between the S/D regions. In some embodiments, fins 204 are portions of substrate 202 (such as a portion of a material layer of substrate 202). For example, in the depicted embodiment, where substrate 202 includes silicon, fins 204 include silicon. Alternatively, in some embodiments, fins 204 are defined in a material layer, such as one or more semiconductor material layers, overlying substrate 202. For example, fins 204 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on the design requirement of device 200. Fins 204 are formed by any suitable process including various deposition, photolithography, and/or etching processes.

Isolation structure 208 is formed over substrate 202 and separates the lower portions of fins 204. Isolation structure 208 electrically isolates active device regions and/or passive device regions of device 200. Isolation structure 208 can be configured as different structures, such as a shallow trench isolation (STI) structure, a deep trench isolation (DTI) structure, a local oxidation of silicon (LOCOS) structure, or combinations thereof. Isolation structure 208 includes an isolation material, such as silicon oxide (SiO), silicon nitride (SiN), silicon oxynitride (SiON), other suitable isolation material, or combinations thereof. Isolation structure 208 is deposited by chemical vapor deposition (CVD), physical vapor deposition (PVD), atomic layer deposition (ALD), high density plasma CVD (HDPCVD), metal organic CVD (MOCVD), remote plasma CVD (RPCVD), PECVD, low pressure CVD (LPCVD), atomic layer CVD (ALCVD), atmospheric pressure CVD (APCVD), other suitable deposition process, or combinations thereof. In some embodiments, isolation structure 208 is formed before fins 204 are formed (an isolation-first scheme). In some other embodiments, fins 204 are formed before isolation structure 208 is formed (a fin-first scheme). A planarization process, such as a chemical mechanical polishing (CMP) process, can be performed on isolation structure 208.

In the depicted embodiment of FIGS. 2 and 3, various gate structures 210 are formed over fins 204. Gate structures 210 extend along the Y-direction and traverse respective fin(s) 204. Gate structures 210 may be formed by a gate replacement process. For example, first, dummy gate stacks are formed to wrap the channel regions of respective fins 204. Each dummy gate stack may include a dummy gate electrode comprising polysilicon and various other layers, for example, a hard mask layer disposed over dummy gate electrode, and an interfacial layer disposed over fins 204 and substrate 202, and below the dummy gate electrode.

Thereafter, spacers 214 are disposed along the sidewalls of the dummy gate stacks. Spacers 214 may comprise one or more dielectric layers. The dielectric layer may include any suitable dielectric material, such as silicon, oxygen, carbon, nitrogen, other suitable material, or combinations thereof, and may be formed by any suitable method, such as ALD, CVD, PVD, other suitable methods, or combinations thereof. Top portions of the dielectric layer(s) may be removed by an etching process (such as dry etching, wet etching, or combinations thereof) or any other suitable process. The remaining portions of the dielectric layer(s) along the sidewalls of the dummy gate stacks form spacers 214.

After the formation of epitaxial S/D features 220 as well as ILD layer 230 (will be discussed later), the dummy gate stacks are removed along spacers 214 using one or more etching processes (such as wet etching, dry etching, or combinations thereof), therefore leaving openings over the channel regions of fins 204 in place of the removed dummy gate stacks. Metal gate stacks 212 are then formed in the openings. For example, the opening is first filled with a high-k (K>3.9) dielectric material to form gate dielectric layer(s) by various processes, such as ALD, CVD, PVD, and/or other suitable process. Metal gate materials are then deposited over the gate dielectric layer to form the metal gate electrodes. In some embodiments, the metal gate electrodes include a work function metal and a fill metal. The work functional metal is configured to tune a work function of its corresponding FET to achieve a desired threshold voltage Vt. The fill metal is configured to serve as the main conductive portion of the functional gate structure. The metal gate electrodes are formed by various deposition processes, such as ALD, CVD, PVD, and/or other suitable process. A CMP process can be performed to remove any excess material of metal gate stacks 212 and/or spacers 214 to planarize gate structures 210. As depicted in FIG. 3, metal gate stacks 212 has a gate length GL in the X-direction.

Still referring to FIGS. 2 and 3, device 200 also includes epitaxial S/D features 220 formed in the S/D regions of fins 204. In some embodiments, first, S/D trenches are formed in the S/D regions of fins 204. The S/D trenches may be formed by an etching process along the sidewalls of spacers 214. Subsequently, semiconductor material (such as silicon germanium (SiGe), silicon phosphide (SiP) or silicon carbide (SiC)) is epitaxially grown in the S/D trenches over fins 204, forming epitaxial S/D features 220. In some embodiments, epitaxial S/D features 220 grow separately over each fin 204, as depicted in FIG. 2. In some other embodiments, epitaxial S/D features 220 extend (grow) laterally along the Y-direction, such that epitaxial S/D features 220 are merged and span more than one fin. In some embodiments, epitaxial S/D features 220 include partially merged portions and/or fully merged portions. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. In some embodiments, epitaxial S/D features 220 are doped with n-type dopants and/or p-type dopants depending on a type of FET fabricated in their respective FET device region. In some embodiments, epitaxial S/D features 220 include materials and/or dopants that achieve desired tensile stress and/or compressive stress in the channel regions.

Device 200 also comprises an interlayer dielectric (ILD) layer 230 formed over substrate 202, including isolation structure 208 and epitaxial S/D features 220, and between gate structures 210. ILD layer 230 includes a dielectric material including, for example, silicon oxide (SiO), silicon nitride (SiN), silicon oxynitride (SiON), tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. In some embodiments, ILD layer 230 has a multilayer structure having multiple dielectric materials. In some embodiments, an ILD layer 230 may be formed by a deposition process (such as CVD, FCVD, PVD, ALD, HDPCVD, MOCVD, RPCVD, PECVD, LPCVD, ALCVD, APCVD, plating, other suitable methods, or combinations thereof) to cover isolation structure 208, epitaxial S/D features 220 and the dummy gate stacks. Subsequent to the deposition of ILD layer 230, a CMP process and/or other planarization process may be performed to expose the dummy gate stacks. Thereafter, the aforementioned metal gate replacement process may be implemented to replace the dummy gate stacks with metal gate stack 212.

Figure 4:
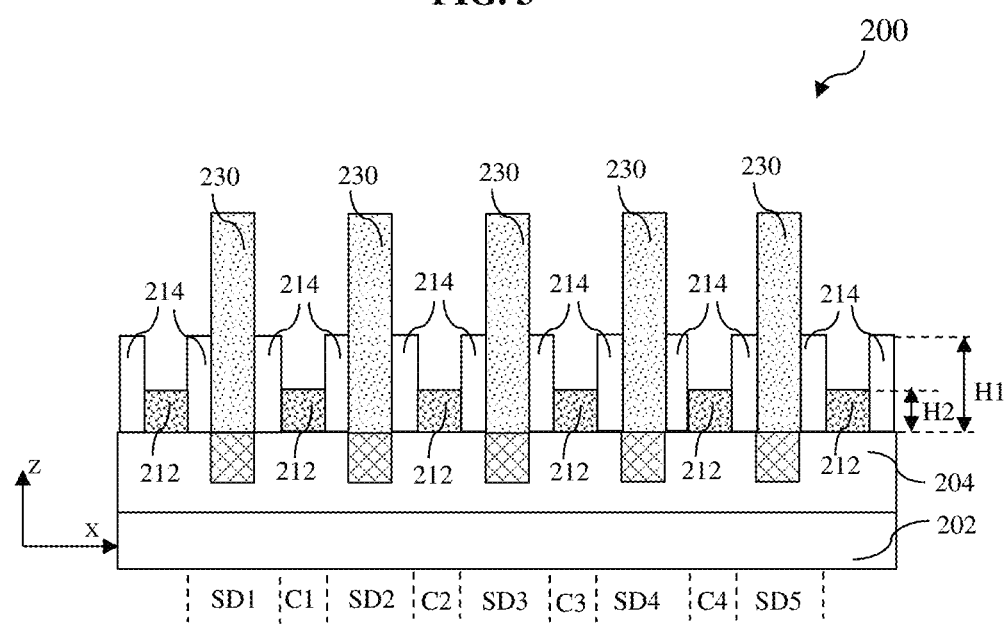

Now referring to FIGS. 1 and 4, at operation 104, metal gate structures 210 are recessed. In some embodiments, both metal gate stacks 212 and spacers are recessed. And, metal gate stacks 212 are further recessed such that top surfaces of metal gate stacks 212 are below top surfaces of spacers 214, and both are below top surface of ILD layer 230. Operation 104 may include various etching processes. For example, first, metal gate stacks 212 are recessed to a thickness H1 by a selective etching process due to the different materials of metal gate stacks 212 and spacers 214. Thereafter, spacers 214 are also selectively etched back to the thickness of H1. Then, metal gate stacks 212 are further selectively etched back to a thickness H2. The selective etching process may be selective dry etch, selective wet etch, other suitable etching process, or combinations thereof. In some embodiments, the thickness H1 is about 2 nm to about 70 nm, and the thickness H2 is about 1 nm to about 50 nm, which is about 10% to about 70% of H1. If the ratio of the thickness H2 to H1 is greater than 70%, it may reduce the volume of the bottom portion of the later formed via 280A, thereby increase the resistance in some instances; and if the ratio of the thickness H2 to H1 is less than 10%, it may cause undesired short circuitry between the source/drain contacts, in some instances.

Figure 5:
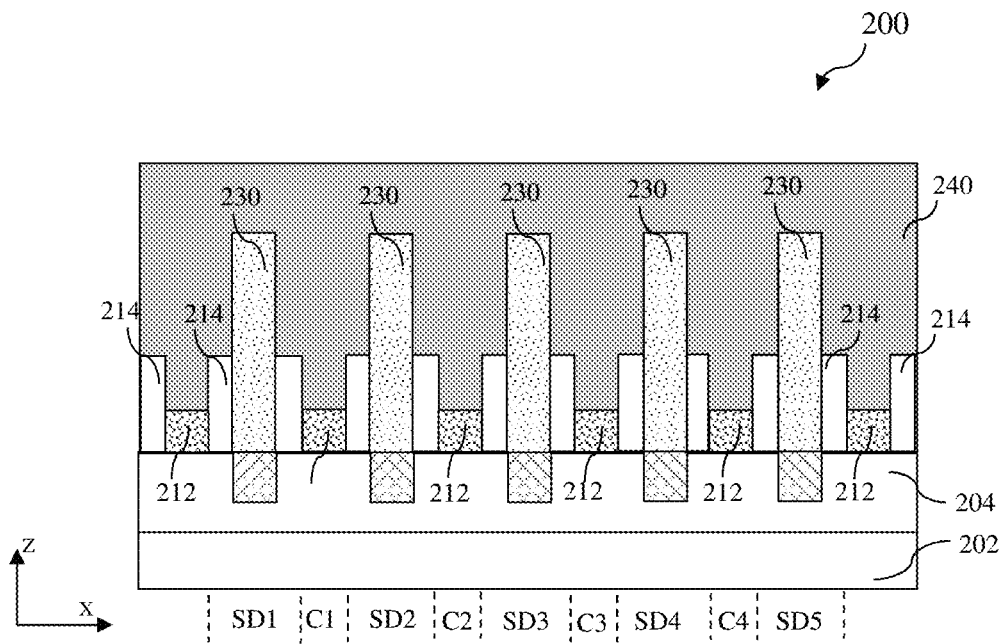
Figure 6:
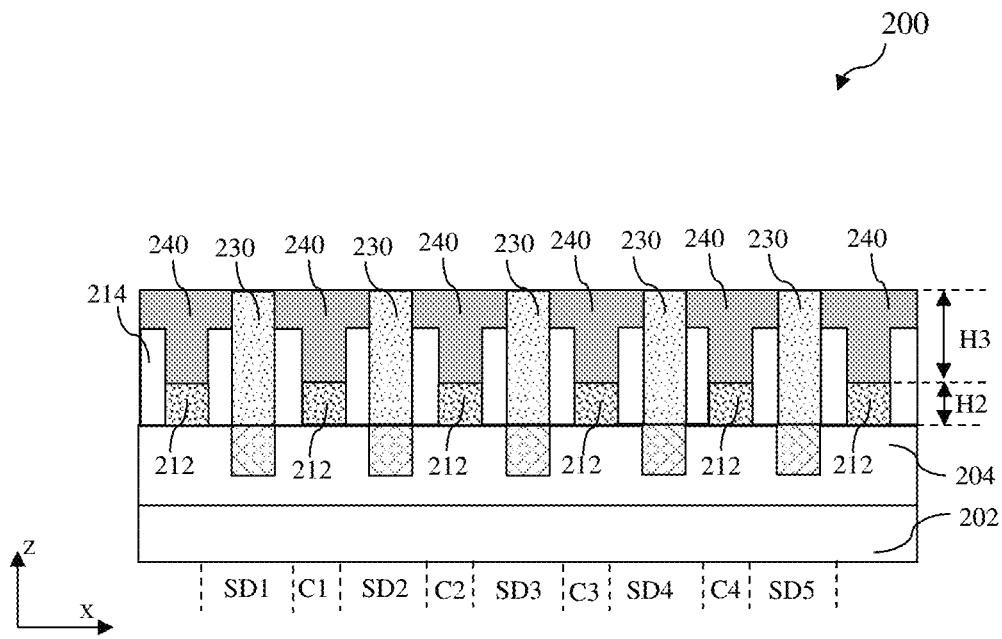
Figure 7:
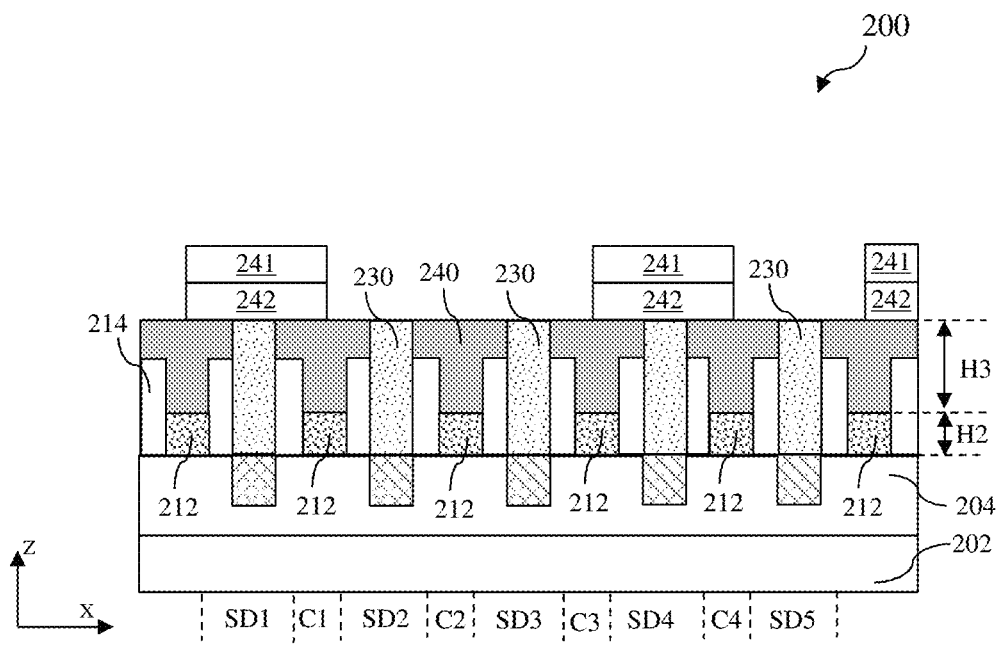

Now referring to FIGS. 1, 5, and 6, at operation 106, a hard mask 240 is deposited over substrate 202. Referring to FIG. 5, hard mask 240 is deposited over ILD layer 230, gate structures 210 and epitaxial S/D features 220. Hard mask 240 includes a different material from that of spacers 214, such that hard mask 240 and spacers 214 can provide different etching selectivity in the following selective etching processes. In some embodiments, hard mask 240 may include one or more layers of material such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, other suitable materials, or combinations thereof. In some embodiments, hard mask 240 is disposed by a deposition processes, such as ALD, CVD, PVD, and/or other suitable process. Referring to FIG. 6, a CMP process or other planarization process is performed to remove the excess material of hard mask 240. In some embodiments, a portion of ILD layer 230 is also removed. In the depicted embodiment of FIG. 6, hard mask 240 has a thickness H3 such that a top surface of hard mask 240 is above a top surface of spacer 214 (H2+H3>H1). In other words, hard mask 240 covers spacers 214. In some embodiments, a thickness H3 of hard mask 240 is about 10 nm to about 50 nm.

Now referring to FIGS. 1 and 7-10, at operation 108, S/D contacts 248 are formed over specific S/D regions (for example, SD2, SD3, and SD5) according to the design requirement of device 200. Forming of S/D contacts 248 comprises multiple processes including various photolithography, etching, and/or deposition processes. For example, referring to FIGS. 7 and 8, a photolithography process is performed. The photolithography process may include forming a photoresist layer (resist) overlying device 200, exposing the resist to a pattern 241, performing a post-exposure bake process, and developing the resist to form a masking element 242 including the resist. Masking element 242 is designed to expose specific S/D regions according to the design requirement of device 200. Masking element 242 is then used to selectively remove ILD layer 230 over the specific S/D regions to form S/D contact openings 244 which expose top surfaces of epitaxial S/D features 220 in the specific S/D regions. The selectively removing process can include a dry etching process (for example, a reactive ion etching (RIE) process), a wet etching process, other suitable etching process, or combinations thereof.

Figure 8:
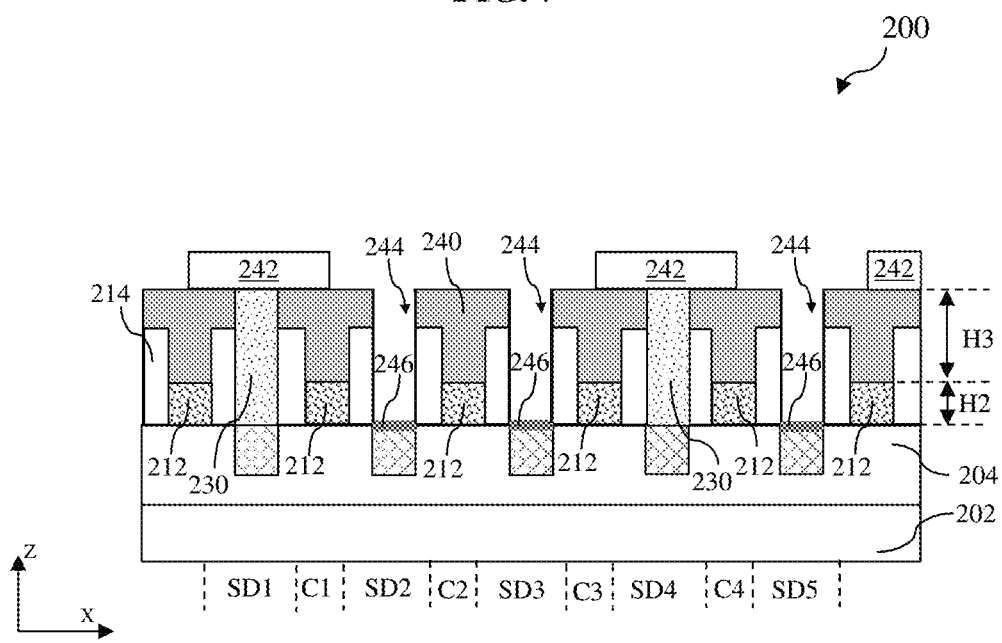

As depicted in FIG. 8, silicide layers 246 are then formed on the top surface of the exposed epitaxial S/D features 220 to reduce the S/D parasitic resistance. In some embodiments, a metal material is deposited on the exposed epitaxial S/D features 220. An annealing process is then performed to cause constituents of the top surfaces of the exposed epitaxial S/D features 220 to react with the metal material. Silicide layers 246 thus include the metal material and a constituent of epitaxial S/D features 220. Subsequently, any unreacted metal materials are removed (e.g. by etching), and the remained reacted material form silicide layer 246.

Figure 9:
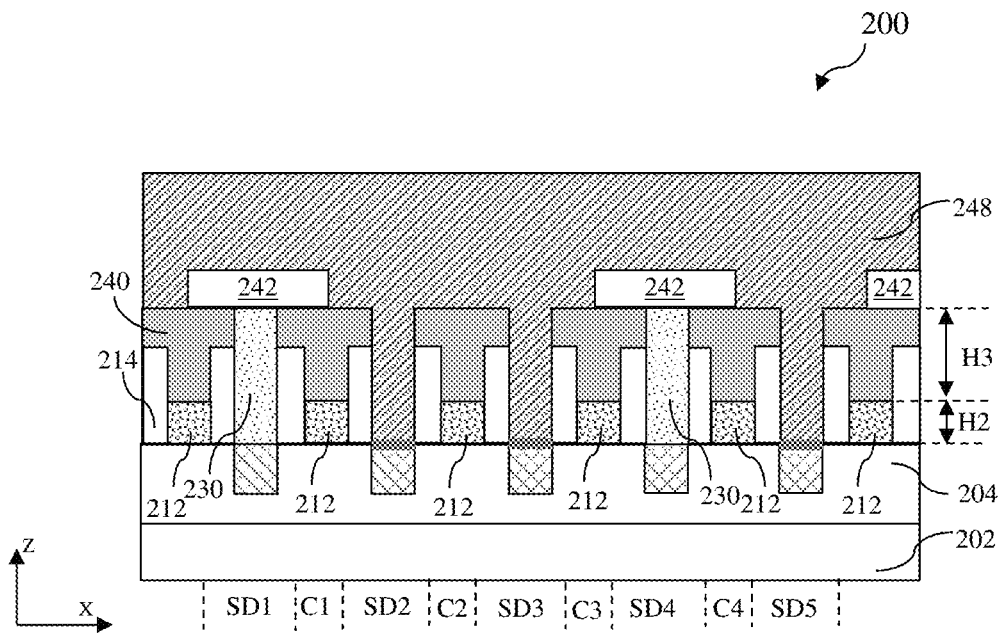
Figure 10:
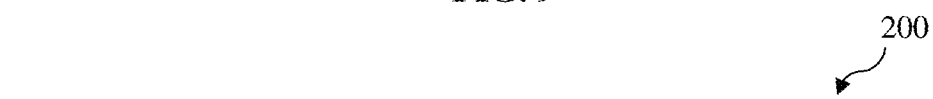

Then, referring to FIGS. 9 and 10, a conductive material is filled in S/D contact openings 244 to form S/D contacts 248. In some embodiments, the conductive material includes tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), other conductive material, or combinations thereof. In some embodiments, the conductive material can be deposited by PVD, CVD, ALD, electroplating, electroless plating, other suitable deposition process, or combinations thereof. Thereafter, one or more polishing processes (for example, CMP) may be performed to remove any excess conductive materials and planarize the top surface of device 200. Masking element 242 can be removed before or after the filling of the conductive material.

Figure 11:
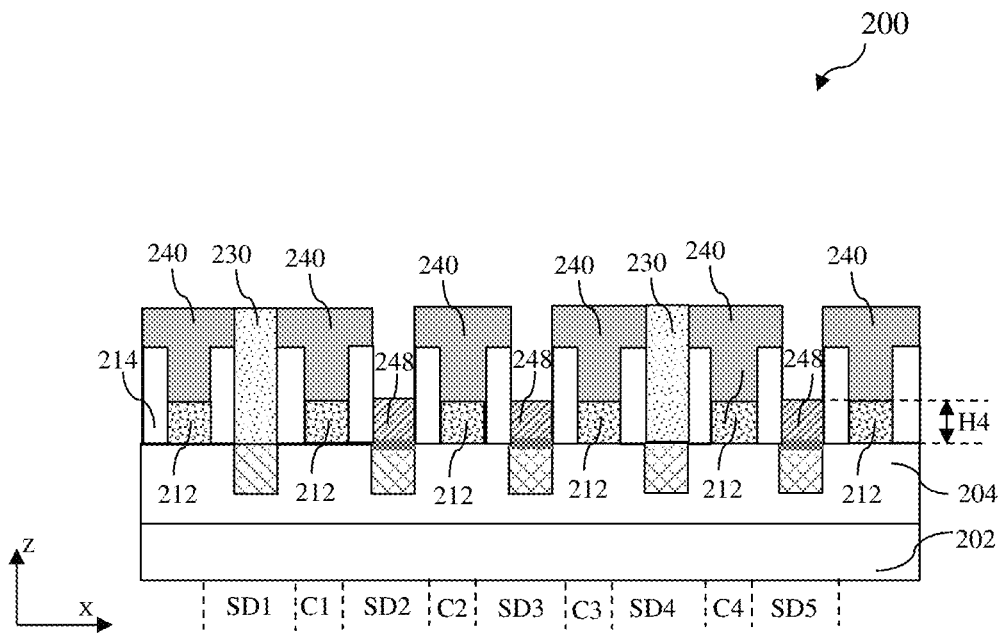
Figure 12:
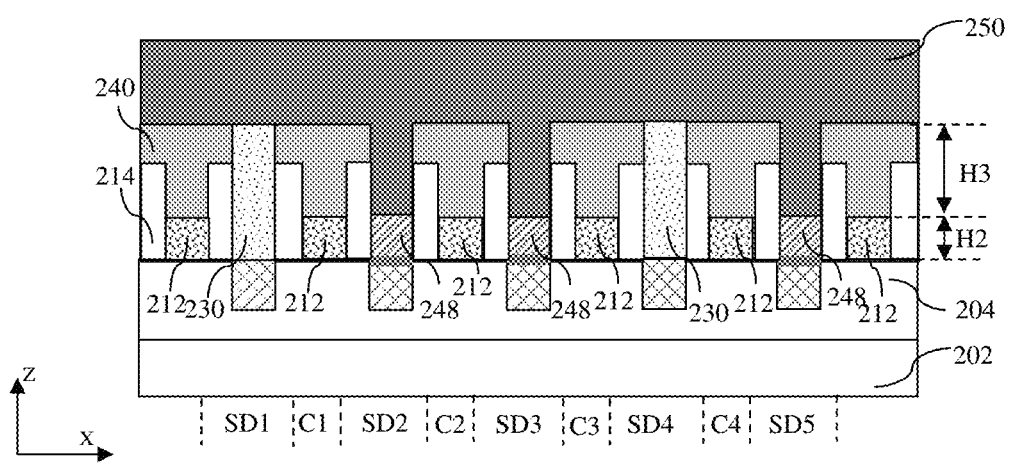
Figure 13:
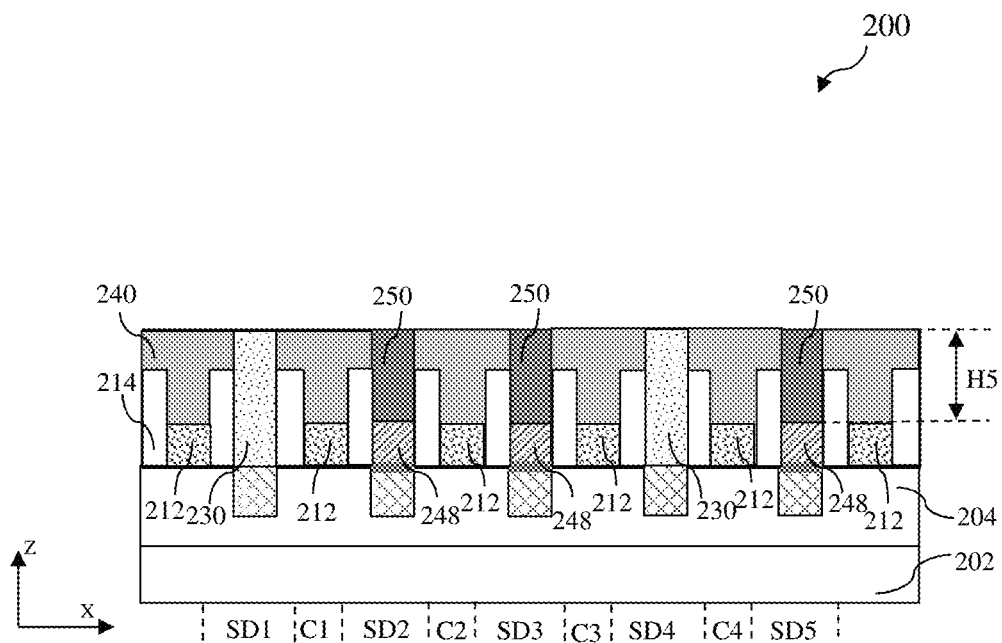

Now referring to FIGS. 1 and 11-13, at operation 110, S/D contacts 248 are recessed and a hard mask 250 is deposited over the recessed S/D contacts 248. Referring to FIG. 11, top portions of S/D contacts 248 are removed by a selective etching process. In some embodiments, S/D contacts 248 are recessed to a thickness H4 which is less than thickness H1 of spacers 214. In other words, top surfaces of S/D contacts 248 are below top surfaces of spacers 214. In some embodiments, thickness H4 of S/D contacts 248 is about 1 nm to about 50 nm which is about 10% to 70% of thickness H1 of spacers 214. Then, referring to FIGS. 12 and 13, a hard mask 250 is formed over the recessed S/D contacts 248. Hard mask 250 includes a material that can provide a different etching selectivity from the material of hard mask 240. In some embodiments, hard mask 250 may include one or more layers of material such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, other suitable materials, or combinations thereof. In some embodiments, hard mask 250 is disposed by a deposition processes, such as ALD, CVD, PVD, and/or other suitable process. And, a CMP process or other planarization process is performed to remove the excess material of hard mask 250 and expose top surfaces of hard mask 240 and ILD layer 230. In some embodiments, a thickness H5 of hard mask 250 is about 10 nm to about 50 nm.

Figure 14:
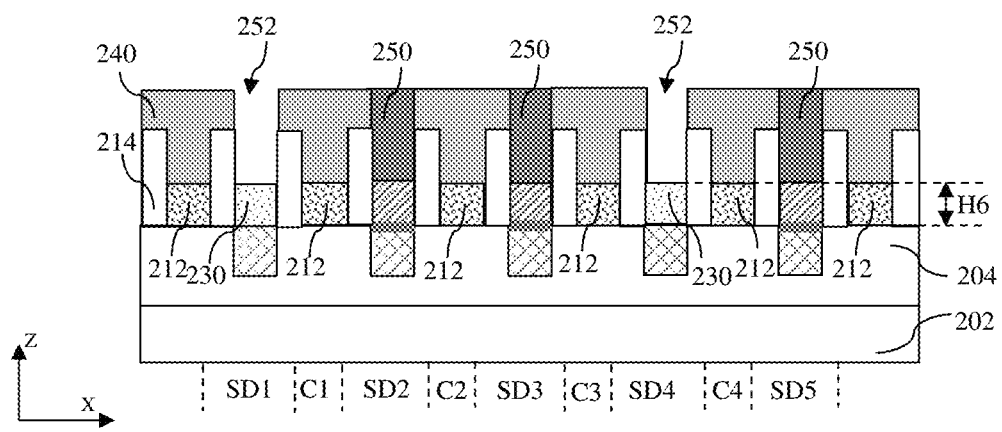

Now referring to FIGS. 1 and 14-16, at operation 112, ILD layer 230 in other S/D regions (such as SD1 and SD4) of fins 204 is recessed and a hard mask 260 is deposited over the recessed ILD layer 230 over the other S/D regions. Referring to FIG. 14, a top portion of ILD layer 230 in S/D regions SD1 and SD4 is removed by a selective etching process. In some embodiments, ILD layer 230 is recessed to a thickness H6 which is less than thickness H1 of spacers 214. In some embodiments, H6 is about 1 nm to about 50 nm which is about 10% to 70% of H1. In some embodiments, thickness H6 of the recessed ILD layer 230 is substantially equal to thickness H2 of the recessed metal gate stacks 214. In some other embodiments, thickness H6 of the recessed ILD layer 230 may be different from thickness H2 of the recessed metal gate stacks 214.

Figure 15:
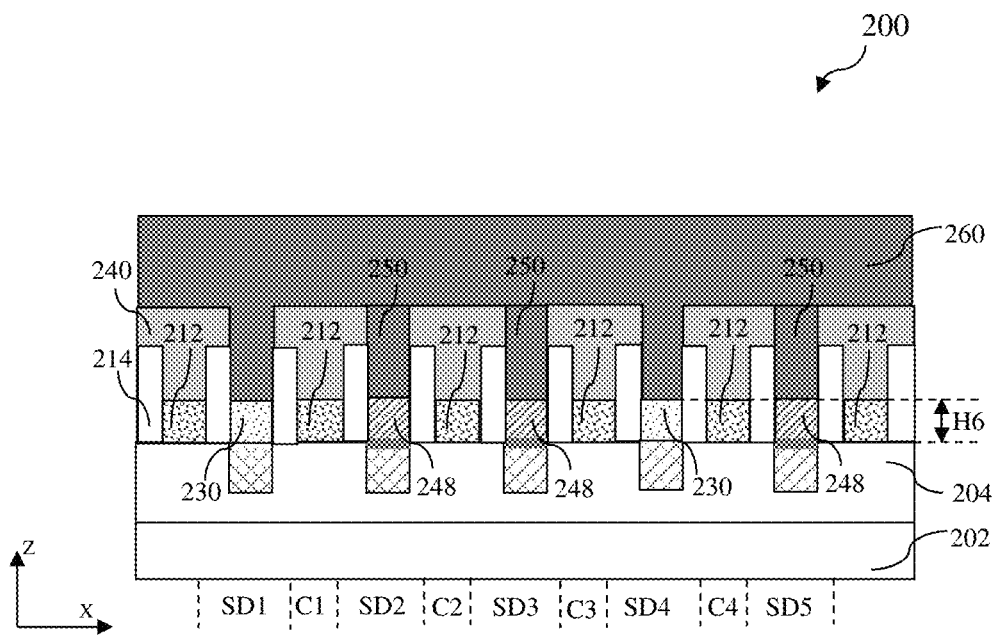
Figure 16:
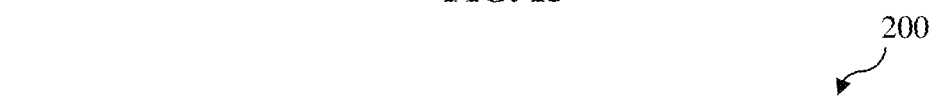
Figure 21:
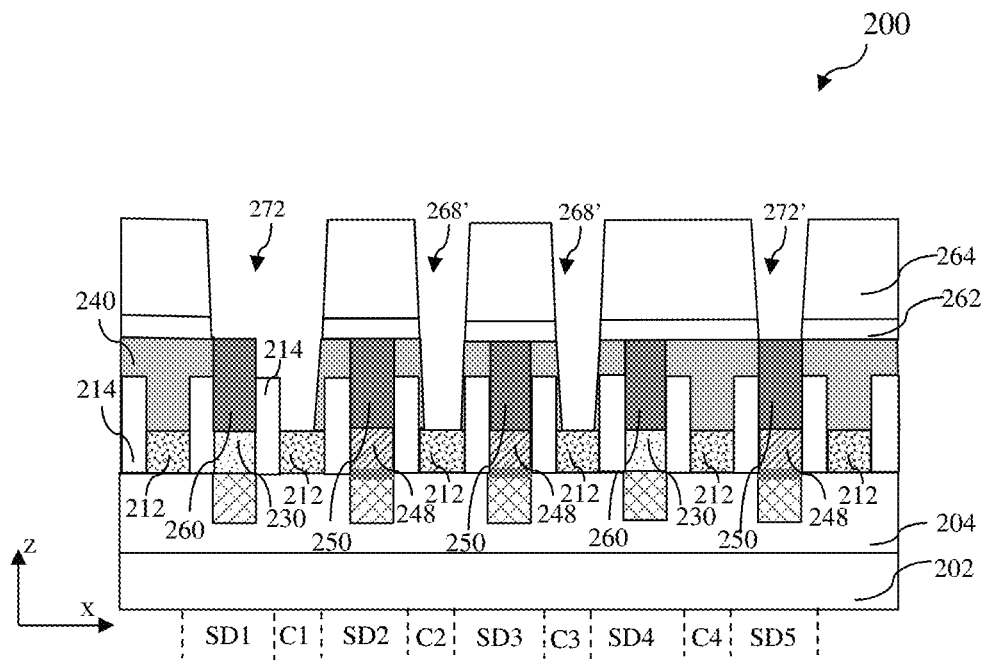
Figure 22:
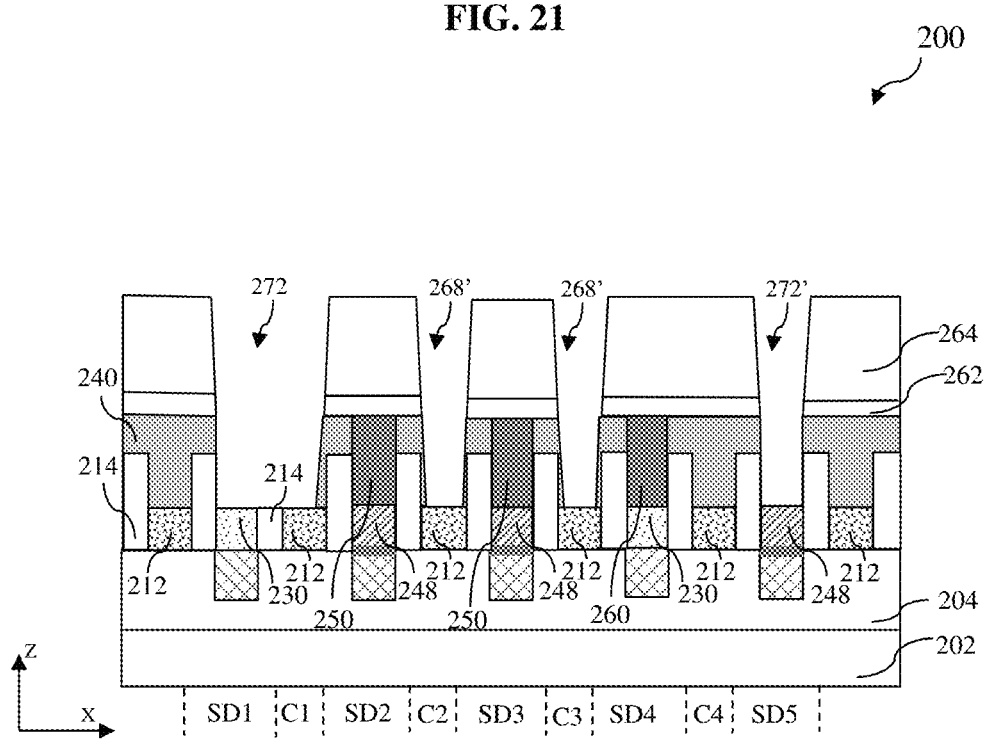

Thereafter, referring to FIGS. 15 and 16, a hard mask 260 is formed over the recessed ILD layer 230. In some embodiments, hard mask 260 includes the same material as hard mask 250, which is different from the material of hard mask 240 and the material of ILD layer 230, such that hard masks 250 and 260 have different etching selectivities than hard mask 240 and the material of ILD layer 230 during the formation of via trenches 272 and 272' (FIGS. 21 and 22). In some embodiments, hard mask 260 may include one or more layers of material such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, other suitable materials, or combinations thereof. In some embodiments, hard mask 250 is disposed by a deposition processes, such as ALD, CVD, PVD, and/or other suitable process. And, a CMP process or other planarization process is performed to remove the excess material of hard mask 260 and expose top surfaces of hard mask 240 and hard mask 250. In some embodiments, a thickness H7 of hard mask 250 is about 10 nm to about 50 nm. As depicted in FIG. 16, a combined thickness of the recessed metal gate stack 212 and hard mask 240 (i.e. H2+H3), a combined thickness of the recessed S/D contact 248 and hard mask 250 (i.e. H4+H5), and a combined thickness of the recessed ILD layer 230 and hard mask 260 (i.e. H6+H7) substantially equal to each other; and all are greater than thickness H1 of spacers 214. Since thickness H2 of metal gate stack 212 and thickness H6 of ILD layer 230 are less than thickness H1 of spacer 214, during the later gate via formation (where spacer 214 between metal gate stack 212 over C1 and ILD layer 230 over SD1 is also recessed), a conductive material can land on both metal gate stack 212 over C1 and ILD layer 230 over SD1, thereby a conductive path of the gate via can be extended for a half pitch distance to ILD layer 230 over SD1. Therefore, the open issue between the gate via and the metal line can be solved and the reliability can be improved.

Figure 17:
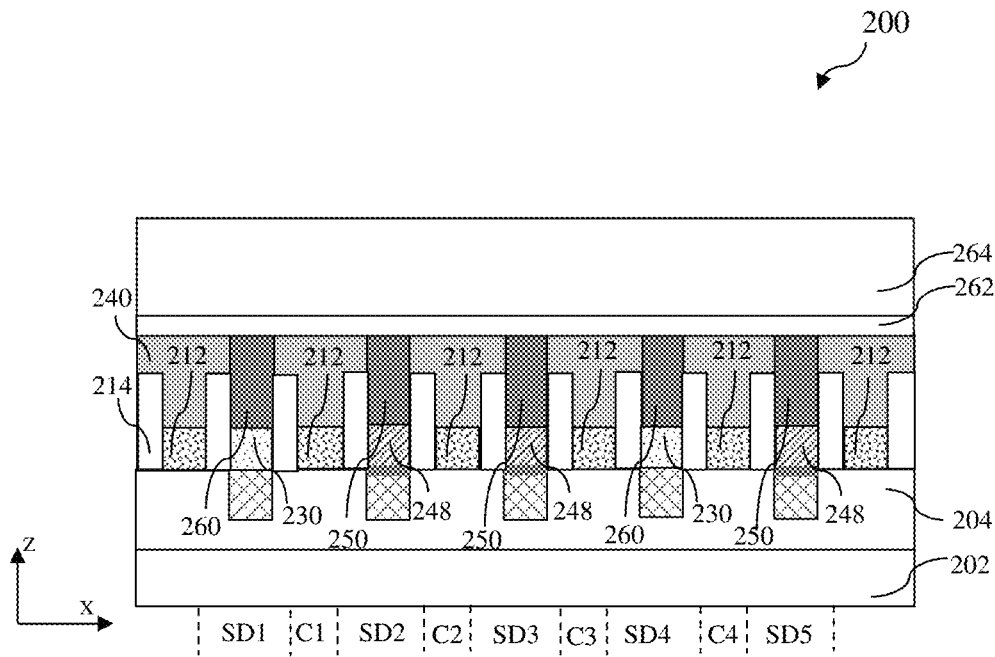

Now referring to FIGS. 1 and 17, at operation 114, an etch stop layer (ESL) 262 and a ILD layer 264 are deposited over device 200. ESL 262 is deposited before the deposition of ILD layer 264. In some embodiments, ESL 262 includes a material of SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, other suitable materials, or combinations thereof. In some embodiments, ILD layer 264 includes a dielectric material such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, other dielectric material, or combinations thereof. The deposition of ESL 262 and ILD layer 264 may include any proper deposition process (such as CVD, PVD, ALD, etc.) and a CMP is performed to planarize the top surface of the layer(s).

Figure 18:
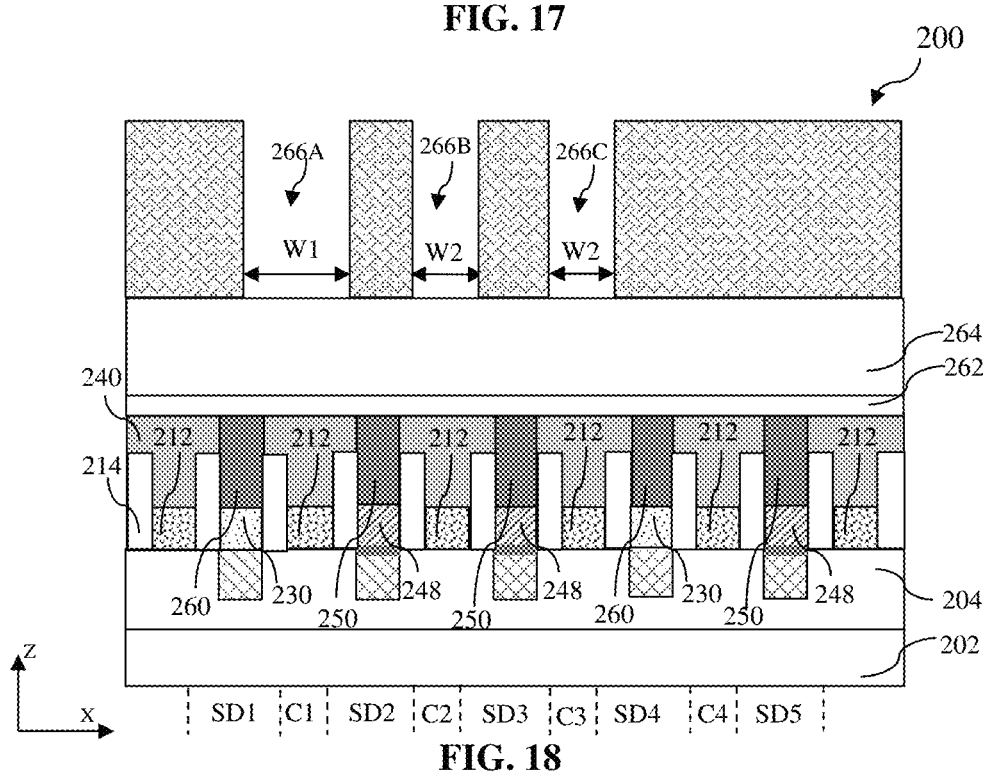

Now referring to FIGS. 1, 18-22, at operation 116, via trenches are formed for device 200. First, referring to FIGS. 18 and 19, a gate slot etching is performed to form via trenches over channel regions (such as C1, C2, and C3) of fins 204. Referring to FIG. 18, a patterned photoresist mask 266 is formed over ILD layer 264. Photoresist mask 266 is patterned according to the design requirement of device 200. In some embodiments, photoresist mask 266 includes slots over continuous channel regions. For example, slots 266A, 266B, and 266C over continuous channel regions C1, C2, and C3, respectively. Chanel region C1 is adjacent to S/D region SD1 covered by ILD layer 230 and S/D region SD2 covered by S/D contact 248. Channel region C2 is adjacent to S/D regions SD2 and SD3, both are covered by S/D contacts 248. Channel region C3 is adjacent to S/D region SD3 covered by S/D contact 248 and S/D region SD4 covered by ILD layer 230. In the depicted embodiment, a width W1 of slot 266A (one of the side slot of three continuous via slots) is greater than a width W2 of slot 266B (the middle slot of three continuous via slots), such that slot 266A is also over spacer 214-1 between ILD layer 230 over SD1 and metal gate stack 212 over C1. Although, in the depicted embodiment, the width W1 is greater than W2 which is substantially equal to W3, it is understood that base on the design requirement of the semiconductor device, it could be another side slot (such as slot 266C) has a width W3 greater than width W1 and W2. Whether it's 266A or 266C, the side slot is over a channel region that is adjacent to a S/D region covered by ILD layer and is away from the middle slot.

Figure 19:
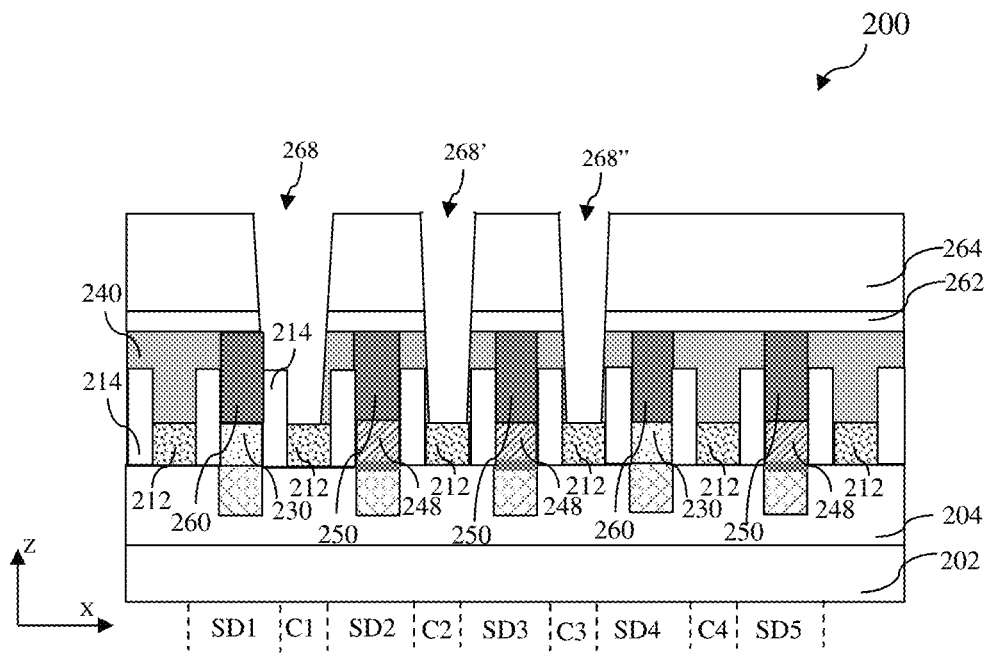

Referring to FIG. 19, one or more etching processes (including dry etch, wet etch, or combinations thereof) are performed along sidewalls of the patterned photoresist mask 266 to form gate via trenches 268 and 268' over continuous channel regions of fins 204. For example, a first anisotropic etching process is performed to remove portions of ILD layer 264 along Z-direction. Subsequently, a second anisotropic etching process is performed to remove portions of ESL 262 along Z-direction, thereby to expose hard mask 240. Thereafter, a third anisotropic selective etching process is performed to remove hard mask 240 to form via trenches 268 and 268'. Since the materials of spacer 214-1 and hard mask 260 are different from that of hard mask 240, spacer 214-1 and hard mask 260 remain substantially unchanged during the formation of via trench 268. In the depicted embodiment, due to the greater slot width, via trench 268 not only expose metal gate stack 212, but also expose spacer 214-1. Via trenches 268' are formed over channel regions C2 and C3 continuous with channel region C1. Via trenches 268' only expose metal gate stack 212.

Figure 20:
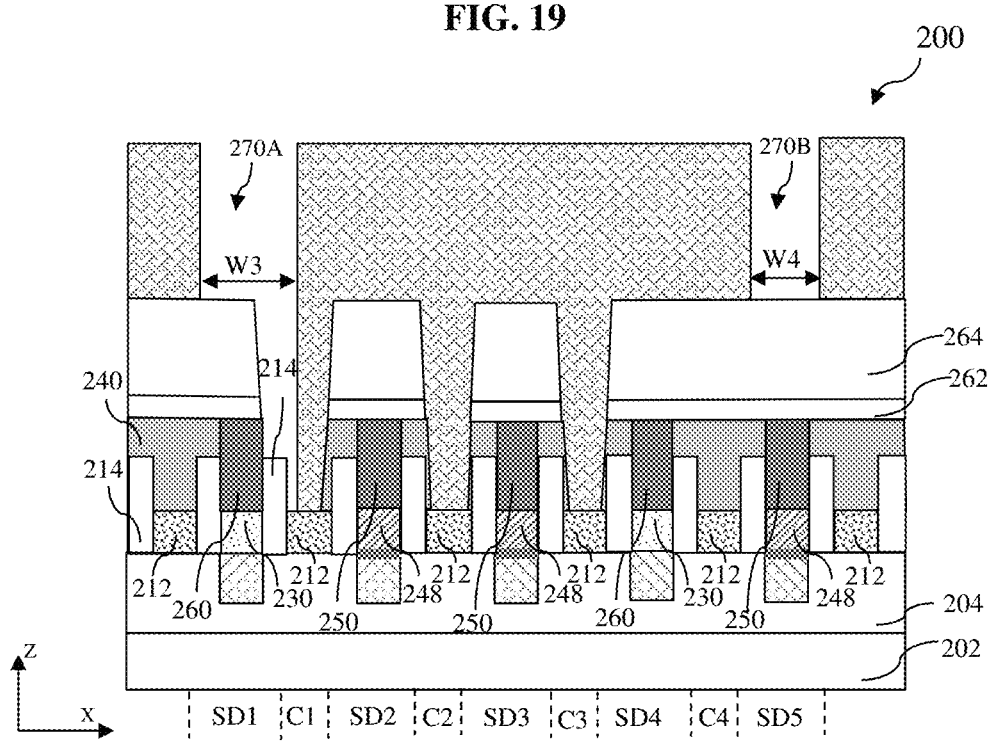

Referring to FIGS. 1, 20-22, still at operation 116, a S/D slot etching is performed to form via trenches over S/D regions (such as SD1 and SD5) of fins 204. Referring to FIG. 20, a patterned photoresist mask 270 is formed over ILD layer 264 as well as within via trenches 268 and 268'. Photoresist mask 270 is patterned according to the design requirement of device 200. In the depicted embodiments, photoresist mask 270 includes at least a slot 270A over the S/D region SD1 covered by ILD layer 230 and is overlapped with via trench 268. Photoresist mask 270 may also include a slot 270B over another S/D region SD5. In some embodiments, a width W3 of slot 270A is greater than a width W4 of slot 270B and is over spacer 214-1.

Thereafter, referring to FIGS. 21 and 22, one or more etching processes (including dry etch, wet etch, or combinations thereof) are performed along sidewalls of the patterned photoresist mask 270 to form via trenches 272 and 272' over S/D regions of fins 204. For example, portions of ILD layer 264 and ESL 262 may be removed by various anisotropic etching processes, such that hard masks 250 and 260 are exposed from the top surface of device 200, as depicted in FIG. 21. A top surface and a sidewall of spacer 214-1 are exposed in via trench 272. Thereafter, a selective etching process is performed to remove hard masks 250 and 260. The exposed portion of spacer 214-1 is also lost (from both top and side) during the etching process to remove hard mask 260. In the depicted embodiment of FIG. 22, ILD layer 230, recessed spacer 214-1, and metal gate stack 212 exposed in via trench 272 are of a substantially (for example, a difference less than 20%) same thickness. In some other embodiments, top surfaces of ILD layer 230, spacer 214-1, and metal gate stack 212 exposed in via trench 272 may be of different thicknesses, but all are less than thickness H1 of spacers 214 not exposed in Via trench 272, such that a conductive material can be deposited over all top surfaces of metal gate stack 212, spacer 214-1, and ILD layer 230 exposed in via trench 272, thereby can extend a conductive path of gate via over channel region C1 over ILD layer 230.

Figure 23:
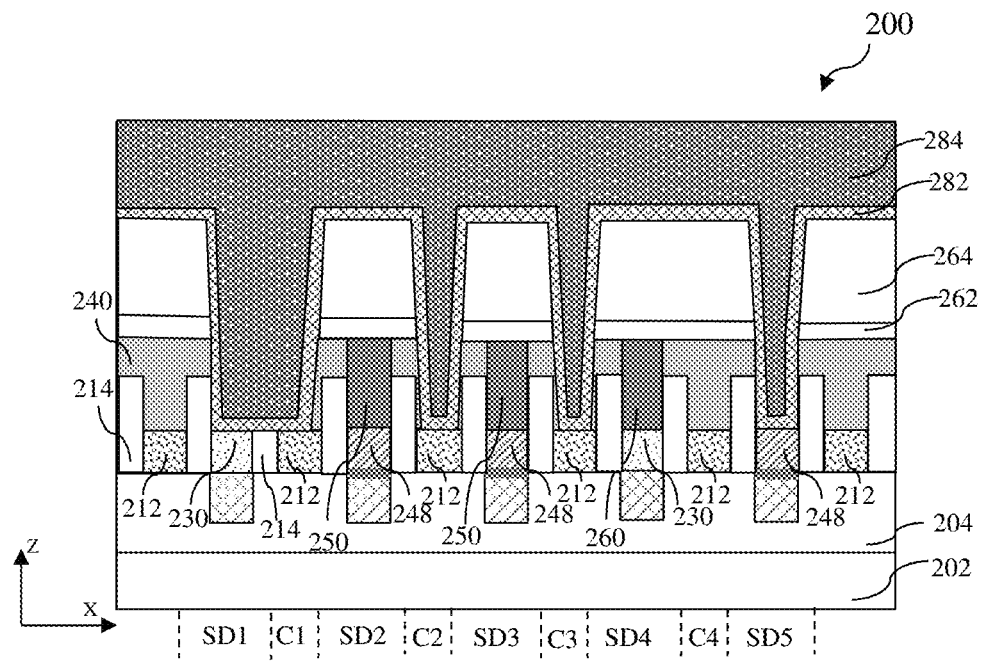
Figure 24:
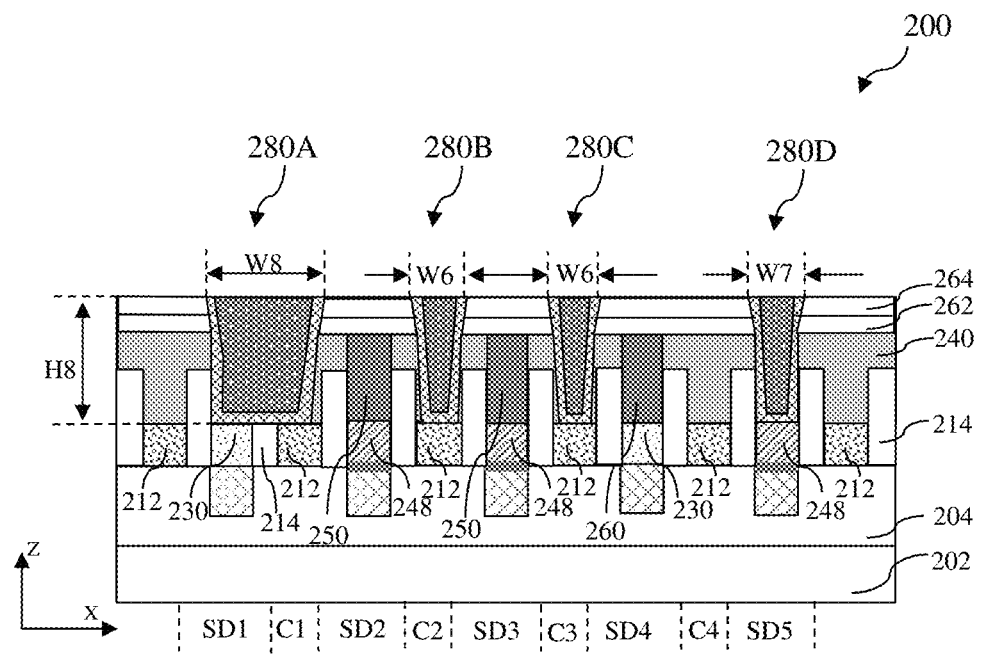

Now referring to FIGS. 1, 23 and 24, at operation 118, vias 280A, 280B, 280C, and 280D (all referred to as vias 280) are formed in via trenches 272, 272' and 268'. In the depicted embodiment, vias 280A, 280B, and 280C land on metal gate stacks 212, and thus are gate vias; via 280D lands on S/D contact 248, thus is a S/D via. Vias 280 are formed by various deposition and planarization processes. Vias 280 includes a conductive material served as a main functional metal of the vias. In some embodiments, vias 280 may also include a barrier layer providing diffusion barrier properties, which can prevent diffusion of the conductive material into ILD layer. And, the barrier layer is optional (not necessary) for the vias. As depicted in FIG. 23, optionally, a barrier layer 282, including a material such as Ta, TaN, Ti, TiN, other suitable material, or combinations thereof, is deposited in via trenches 272, 272', and 268' and over ILD layer 264. In some embodiments, barrier layer 282 has a thickness of less than about 5 nm. A conductive material 284 is then deposited over barrier layer 282 within via trenches 272, 272', 268' and over ILD layer 264 by CVD, PVD, ALD, plating, other suitable process, or combinations thereof. Conductive material 284 includes W, Ru, Co, Cu, Mo, Ni, other conductive materials, or combinations thereof. Subsequently, referring to FIG. 24, a planarization process (such as a CMP) is performed to remove top portion of conductive material 284 (and top portion of barrier layer 282 if available). In some embodiments, a top portion of ILD layer 264 is also removed. The remained portions of conductive material 284 (and barrier layer 282 if available) form vias 280. Referring to FIG. 24, via 280A is landed on metal gate stack 212, extends over spacer 214-1, and further extends on ILD layer 230. Thus, via 280A extends the conductive path from metal gate stack 212 over channel region C1 to ILD layer 230 over S/D region SD1. Vias 280B and 280C land on metal gate stacks 212 over channel regions C2 and C3, respectively; and via 280D land on S/D contact 248 over S/D region SD5. Referring to FIG. 24, gate via 280A has a thickness H8 and a width W8. Width W8 of gate via 280A is greater than a width W6 of gate vias 280B or a width W7 of S/D via 280D. Thickness H8 of gate via 280A is substantially equal to thicknesses of gate vias 280B and S/D via 280D. In some embodiments, the thickness H8 is about 2 nm to about 70 nm, and the width W8 is about is about 10 nm to about 60 nm.

Figure 25:
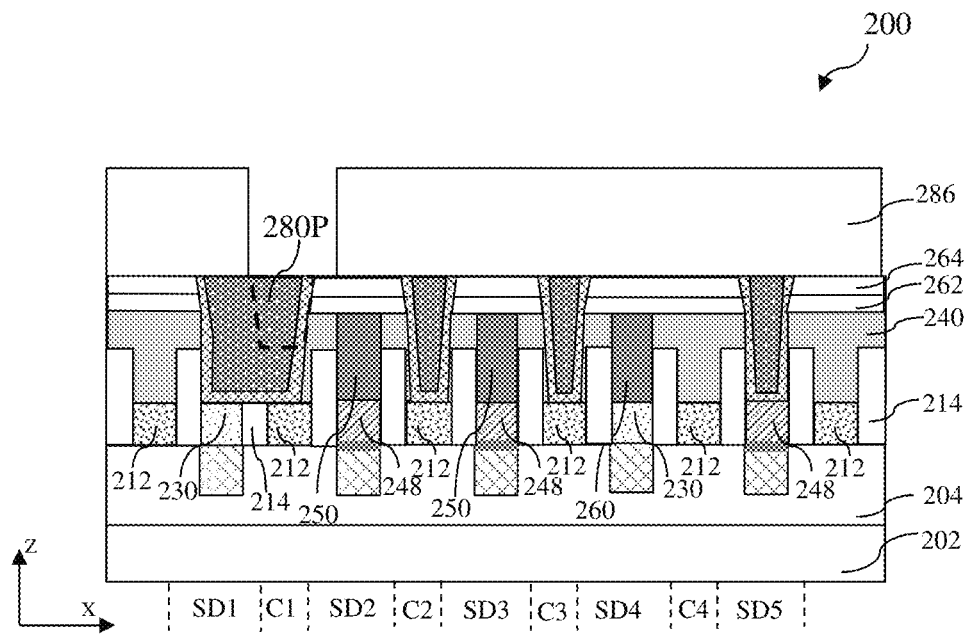
Figure 26:
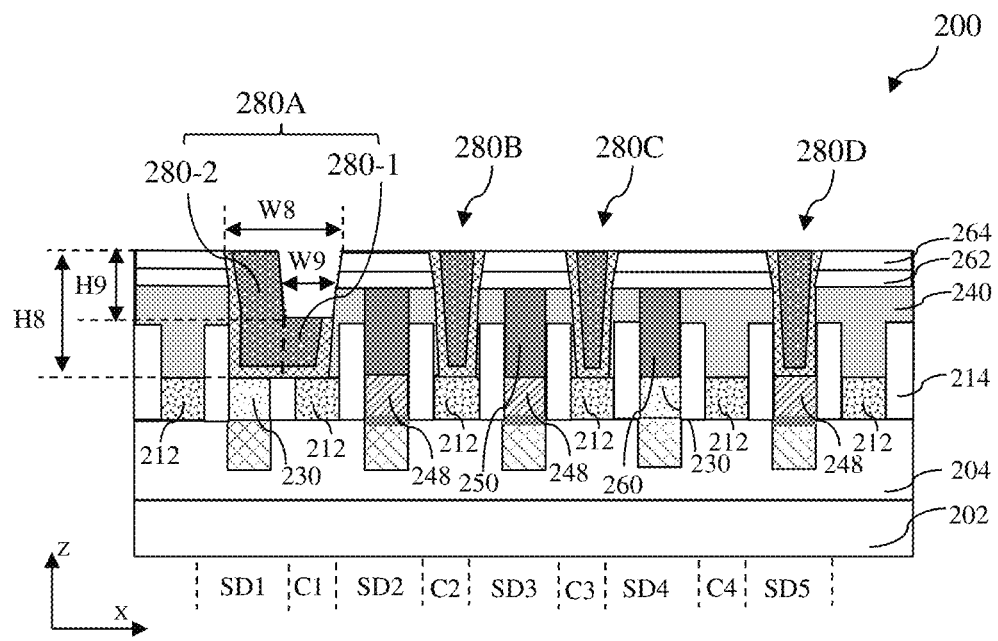

Now referring to FIGS. 1, 25, and 26, at operation 120, a top corner portion of via 280A is removed such that via 280A turns into an L-shape via. Referring to FIG. 25, a patterned photoresist mask 286 is formed over device 200. Photoresist mask 286 includes an opening exposing a portion of the top surface of via 280A over metal gate stack 212 in channel region C1. An etching process is then performed through the opening of photoresist mask 286 to remove a top corner portion 280P of via 280A. Due to the different selectivities between the conductive material of via 280A and the dielectric materials of ILD layer 264, ESL 262, and hard mask 240, a selective metal etching process is implemented to remove the top corner portion 280P. In the case that via 280A include a barrier layer, both barrier layer 282 and conductive material 284 in the top corner portion 280P are moved. For example, the selective metal etching process may include an oxygen base etchant with a flow rate of about 5 sccm to about 200 sccm and a plasma power of about 50 W to about 250 W, and under a pressure of about 1 mTorr to about 100 mTorr. Thereby, via 280A turns into L-shape after the selective metal etching process, as depicted in FIG. 26. In some embodiments, the removed top corner portion 280P has a width W9 which is about 10% to about 90% of the width W8 of via 280A, and a thickness H9 is about 10% to about 90% of the thickness H8 of via 280A. If the removed top corner portion 280P is too big (for example, W9 is more than 90% of W8, or H9 is more than 90% of H8), the L-shape via 280A may be too thin, thereby cause large resistance or even a break out between the conductive features in some instances; or if the removed top corner portion 280P is too small (for example, W9 is less than 10% of W8, or H9 is less than 10% of H8), the later formed patterned dielectric layer 292A may not have a enough width, thereby cause undesired short circuitry between the metal lines 296A and 296B in some instances. In some embodiments, the width W9 is about 1 nm to about 50 nm, and the thickness H9 is about 1 nm to about 50 nm. Referring to FIG. 26, L-shape via 280A includes a first portion 280-1 and a second portion 280-2. The first portion 280-1 contacts a top surface of metal gate stack 212 over channel region C1 and the second portion 280-2 contacts a top surface of ILD layer 230 over S/D region SD1. A top surface of the first portion 280-1 is below a top surface of the second portion 280-2 for a distance H9 which is about 10% to about 90% of a thickness H8 of the second portion 280-2. If the distance H9 is greater than 90%, the first portion 280-1 may be too thin which is easy to be break out or cause large resistance between the conductive features; if the distance H9 is less than 10%, high capacitance may occur between the via 280A and the upper level adjacent metal lines, or even a short circuitry may occur therebetween. In other words, the first portion 280-1 has a thickness H8-H9, which is about 10% to about 90% of a thickness H8 of the second portion 280-2. The first portion 280-1 has a width W9 which is about 10% to about 90% of the combined width W8 of the first portion 280-1 and the second portion 280-2. In some embodiments, depends on the width W9, the first portion 280-1 may also contact a top surface of spacer 214 and/or a portion of a top surface of ILD layer 230. In some embodiments, depends on the width W9, the second portion 280-2 may also contact the top surface of spacer 214 and/or a portion of the top surface of metal gate stack 214. In some embodiments, a sidewall of the first portion 280-1 away from the second portion 280-2 may contact hard mask 240 and/or spacer 214, ESL 262, and ILD layer 264, and a sidewall of the second portion 280-2 away from the first portion 280-1 may contact ESL 262, ILD layer 264, spacer 214, and/or hard mask 240.

In the case that vias 280 include a barrier layer 282, the barrier layer 282 around via 280A extends along a sidewall of the first portion 280-1 away from the second portion 280-2, to a bottom surface of L-shape via 280A (including bottom surfaces of the first portion 280-1 and the second portion 280-2), and further extends to a sidewall of the second portion 280-2 away from the first portion 280-1. Top surfaces of the first portion 280-1 and second portion 280-2 are free of barrier layer 282. And, a sidewall of the second portion 280-2 towards the first portion 280-1 is also free of barrier 282.

Figure 27:
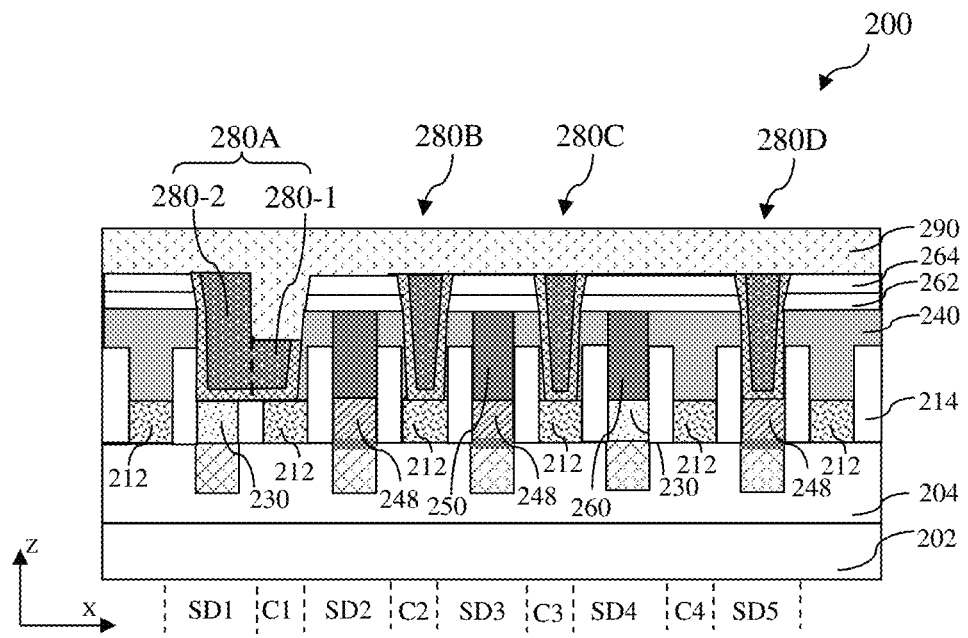
Figure 28:
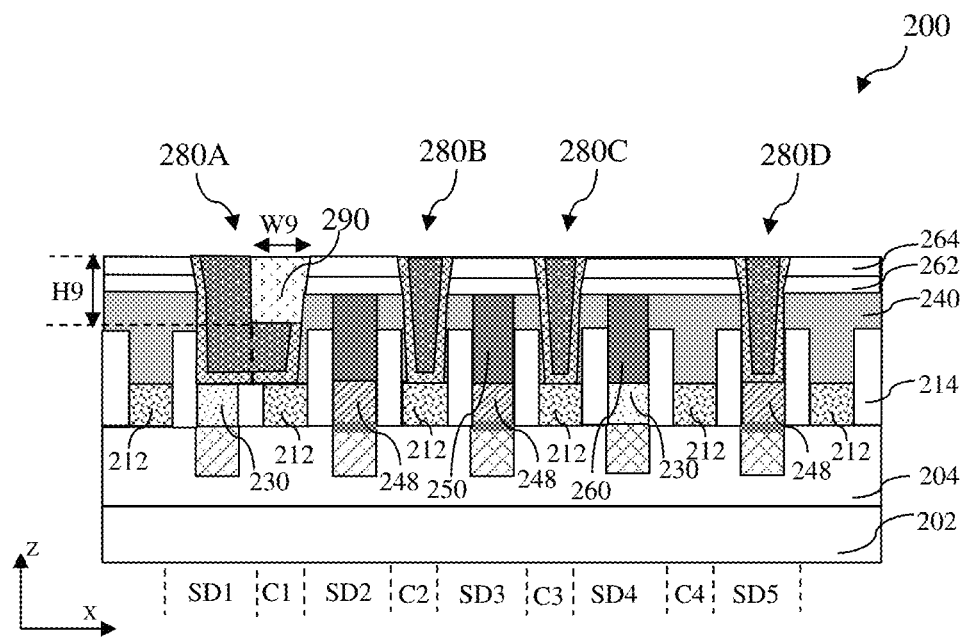
Figure 29:
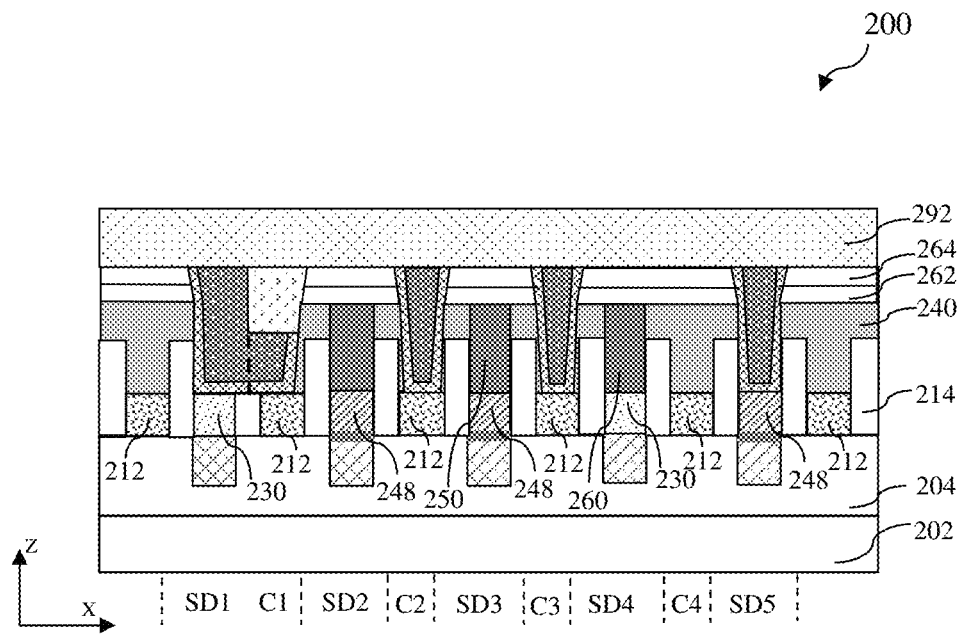

Now referring to FIGS. 1, 27, and 28, at operation 122, a dielectric feature 290 (also referred to as a hard mask 290) is formed in the place of the removed top corner portion 280P of via 280A. Dielectric feature 290 includes a low-K dielectric material (K<3.9) such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, other suitable materials, or combinations thereof. In some embodiments, the material of dielectric feature 290 is disposed over the removed top corner portion 280P of via 280A and over ILD layer 264 by a suitable deposition processes, such as ALD, CVD, PVD, and/or other suitable process. Thereafter, a CMP process or other planarization process is performed to remove the excess material of dielectric feature 290. Referring to FIG. 28, a bottom surface of dielectric feature 290 contacts the top surface of the first portion 280-1 of via 280A. In the case that via 280A includes a barrier layer 282, the bottom surface of dielectric feature 290 contacts both top surfaces of the conductive material 284 and barrier layer 282. A sidewall of dielectric feature 290 contacts the sidewall of the second portion 280-2 towards the first portion 280-1 of via 280A. A top surface of dielectric feature 290 is substantially coplanar with the top surface of the second portion 280-2 of via 280A. In some embodiments, dielectric feature 290 has a width W9 and a thickness H9. Wherein, W9 is about 1 nm to about 50 nm which is about 10% to about 90% of a width W8 of via 280A, and H9 is about 1 nm to about 50 nm which is about 10% to about 90% of a thickness H8 of via 280A.

Figure 30A:
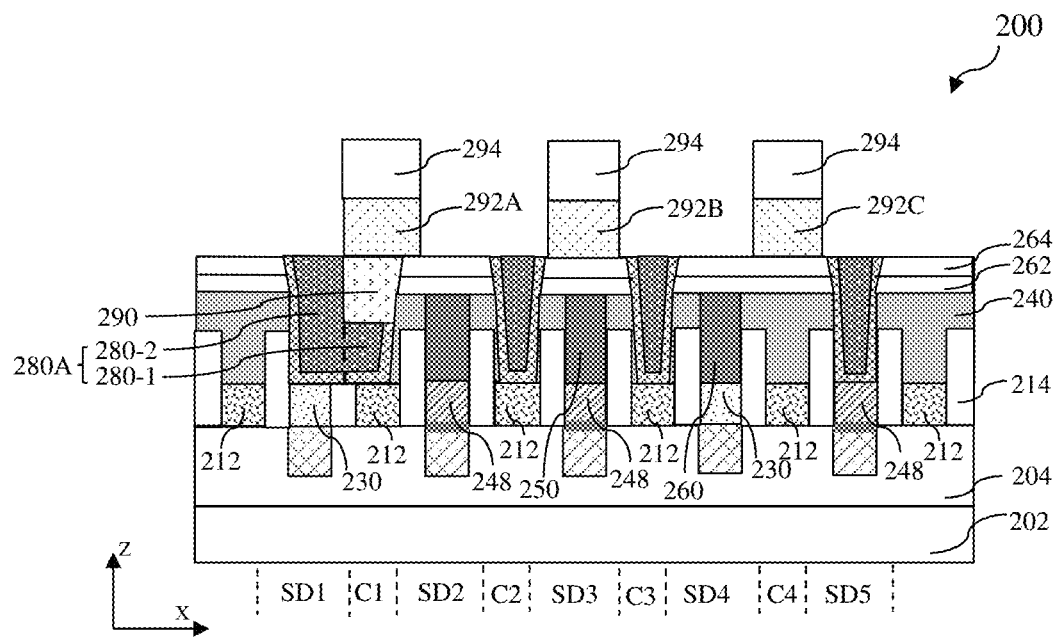
Figure 30B:
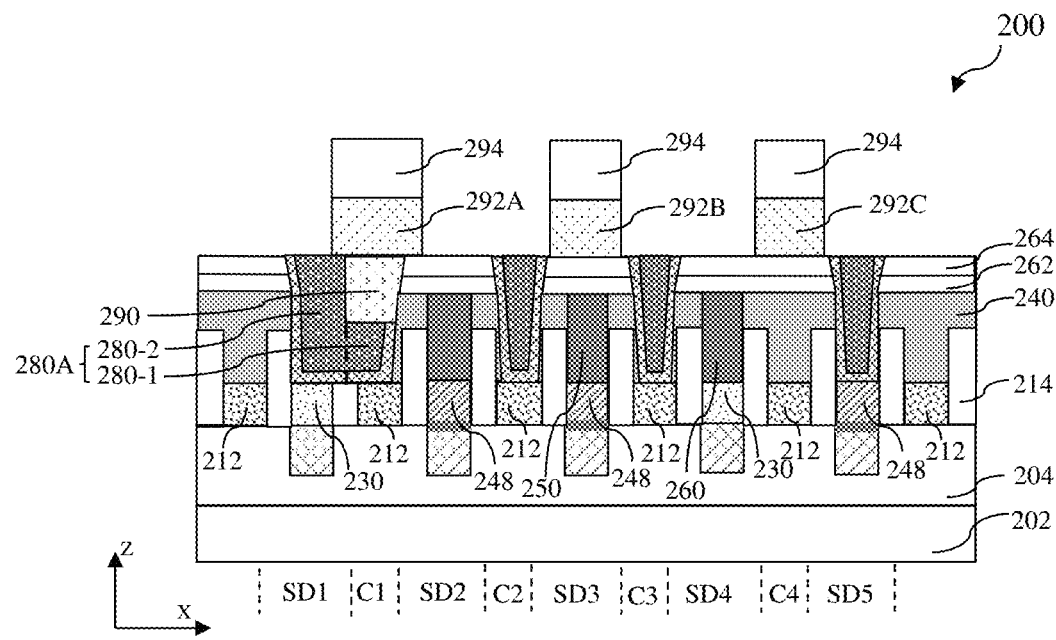
Figure 31:
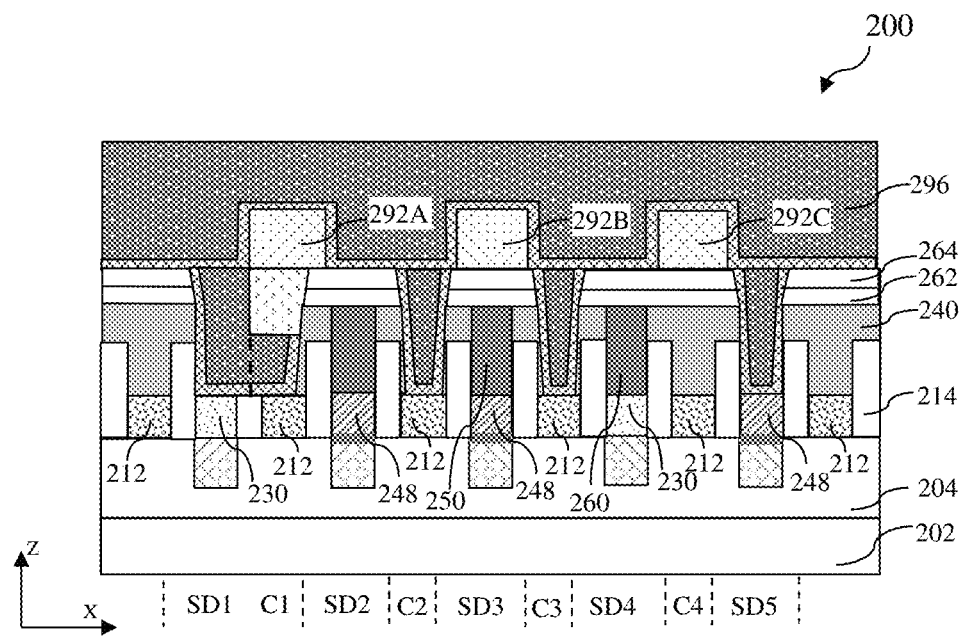
Figure 32:
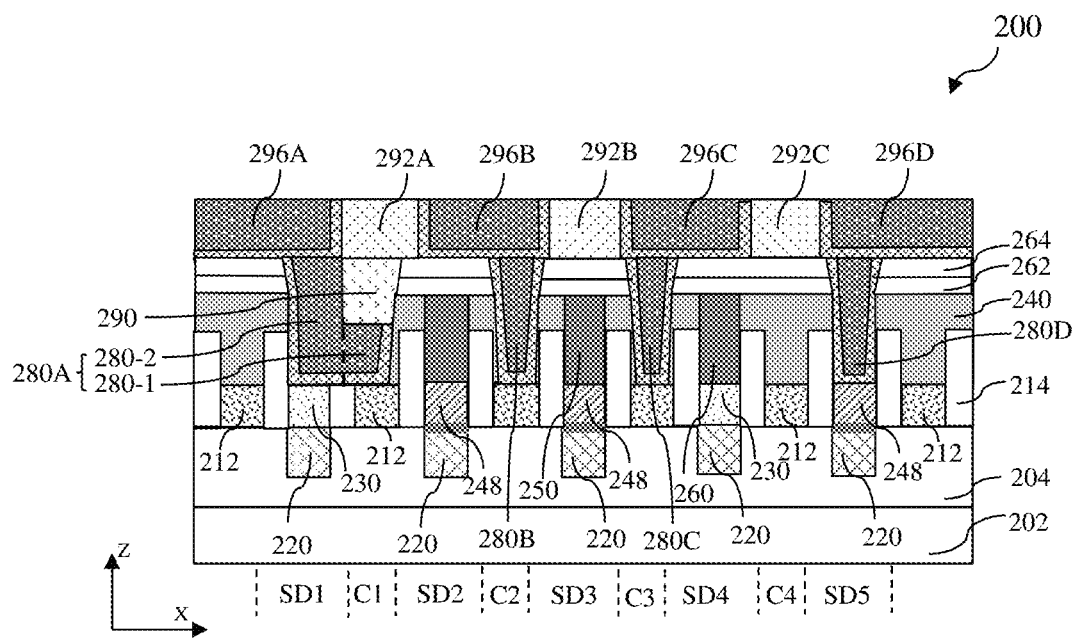
Figure 33:
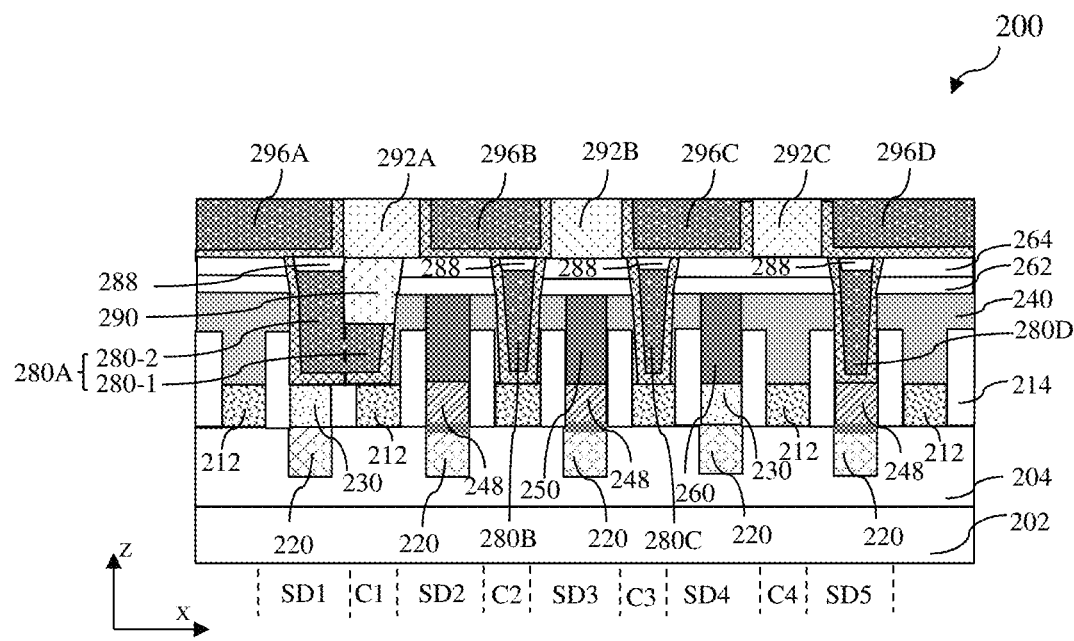

Now referring to FIGS. 1, 29, 30A, 30B, 31, and 32, at operation 124, other processes (such as back-end-of-line (BEOL) fabrication) are performed to complete the fabrication of device 200. For example, referring to FIG. 29, a dielectric layer 292 is deposited over device 200, specifically over ILD layer 264, vias 280, and dielectric feature 290. Thereafter, as depicted in FIGS. 30A and 30B, the dielectric layer 292 is patterned through a photoresist mask 294 to form a patterned dielectric layer 292 (also referred to as cut ending) including different portions such as 292A, 292B, 292C, and more, to define the positions of later formed metal lines 296. In some embodiments, as depicted in FIG. 30A, patterned dielectric layer 292 exposes top surfaces of vias 280 and covers the top surface of dielectric feature 290. In some other embodiments, as depicted in FIG. 30B, patterned dielectric layer 292A can overlap with the second portion 280-2 of via 280A. That is, patterned dielectric layer 292A can be in direct contact with the second portion 280-2 of via 280A, dielectric feature 290, and ILD layer 264. Patterned dielectric layer 292A in different embodiments can cause different contacting areas between the later formed metal lines 296A and via 280A. Although FIGS. 31-33 are described base on the embodiment of the patterned dielectric layer 292A of FIG. 30A, it is understood that a shifting of metal line 296A position may occur according to the patterned dielectric layer 292A as depicted in FIG. 30B.

Referring to FIGS. 31 and 32, metal lines 296A, 296B, 296C, and 296D (all referred to as metal lines 296) are formed over ILD layer 264 and vias 280. In some embodiments, metals lines 296 includes a conductive material such as W, Ru, Co, Cu, Mo, Ni, other conductive material, or combinations thereof. Formation of metal lines 296 includes one or more deposition processes (such as CVD, PVD, ALD, plating, etc.) followed by a planarization process (such as CMP). Similar as the vias 280, metal lines 296 may or may not include a barrier layer having a material of Ti, TiN, Ta, or TaN disposed around the conductive material of the metal lines 296. Thereafter, other dielectric layers and conductive features may be formed to finish the fabrication of device 200.

As depicted in FIG. 32, all metal lines 296 connects to metal gate stacks 212. Metal line 296A contacts the top surface of the second portion 280-2 of via 280A disposed on ILD layer 230 over S/D region SD1. And, the conductive path is extended to the first portion 280-1 of via 280A to metal gate stack 212 over channel region C1. Metal line 296B contacts a top surface of via 280B disposed on metal gate stack 212 over channel region C2. Metal line 296C contacts a top surface of via 280C disposed on metal gate stack 212 over channel region C3. Patterned dielectric layer portions 292A and 292B are disposed between the metal lines 296A and 296B, and between the metal lines 296B and 296C, respectively.

In some embodiments, each of vias 280 may include a metal capping layer 288 on the top of via 280. Referring to FIG. 33, capping layer 288 of via 280A is over the second portion 280-2 and contacts metal line 296A. The first portion 280-1 of via 280A is free of capping layer 288. In the depicted embodiment, capping layers 288 of vias 280B, 280C, and 280D cover the entire conductive surface thereof. In some embodiments, capping layer 288 includes a material such as Al, Ru, Co, Ta, Ti, Cu, other metal material, or a combination thereof and is deposited over the second portion 280-2 of via 280A and the entire conductive surfaces of vias 280B, 280C, and 280D.

Due to the challenge of the size scaling down in semiconductor industry, in a conventional continuous gate via scheme where no L-shape gate via is formed over the continuous channel regions (or metal gate stacks), distance between the gate vias over the adjacent channel regions may be very short. Since the pitch size between the metal lines (minimum center to center distance between the adjacent metal lines) is decided by the size of the cut ending (for example, portions of the patterned dielectric layer), the middle one of the metal lines over the continuous channel regions may be very short, thus may cause high resistance and degrade the performance of the semiconductor device. Or, if the side gate via over the continuous channel regions is landed below the dielectric cut ending and separate from the metal line, an open issue will occur to the side gate via, which may reduce the reliability of the semiconductor device.

However, in the present disclosure, the side gate via 280A (in a continuous gate via scheme) is formed in an L-shape which extends the conductive path to a S/D region covered by a dielectric material (ILD layer 230) and is away from the middle gate via 280B. In other words, a conductive path of gate via 280A extends from metal gate stack 212 over channel region C1 to ILD layer 230 over S/D region SD1 and connects to metal line 296A via the first portion 280-1 over channel region C1 and the second portion 280-2 over S/D region SD1. Thereby, the pitch size between metal line 296A and 296B is enlarged, for example, for a half pitch. Therefore, metal line 296A over gate via 280A can shifted away from gate via 280B. As a result, the size of the middle metal line 296B is no need to be reduced, and the contacting between the side metal line 296A and the side gate via 280A are enhanced. Dielectric feature 290 further ensure the isolation between gate via 280A and metal line 296B, thereby to mitigate the shortage issue that may happen therebetween. Therefore, the reliability and performance of the semiconductor device can be increased.

Although not intended to be limiting, one or more embodiments of the present disclosure provide many benefits to a semiconductor device and a formation process thereof. For example, embodiments of the present disclosure provide a semiconductor device includes an L-shape conductive feature (for example, a gate via) which extends the conductive path away from an adjacent same level conductive feature (for example, an adjacent gate via), such that the pitch size of the higher level conductive features (for example, metal lines) can be enlarged. The present disclosure mitigates the high resistance and open issue of the conventional semiconductor device and increases the performance and reliability of the semiconductor device.

The present disclosure provides for many different embodiments. Semiconductor device having L-shape conductive feature and methods of fabrication thereof are disclosed herein. An exemplary semiconductor device comprises a semiconductor fin disposed over a substrate; a metal gate structure disposed over a channel region of the semiconductor fin; a first interlayer dielectric (ILD) layer disposed over a source/drain (S/D) region next to the channel region of the semiconductor fin; and a first conductive feature including a first conductive portion disposed on the metal gate structure and a second conductive portion disposed on the first ILD layer, wherein a top surface of the first conductive portion is below a top surface of the second conductive portion, a first sidewall of the first conductive portion connects a lower portion of a first sidewall of the second conductive portion.

In some embodiments, the semiconductor device further comprises a first dielectric feature disposed on the first conductive portion of the first conductive feature, wherein a bottom surface of the first dielectric feature contacts a top surface of the first conductive portion of the first conductive feature, and a first sidewall of the first dielectric feature connects an upper portion of the first sidewall of the second conductive portion of the first conductive feature. In some embodiments, the first conductive feature of the first conductive feature includes a barrier layer having a first portion along a second sidewall of the first conductive portion of the first conductive feature, a second portion along a second sidewall of the second conductive portion of the first conductive feature, and a third portion below bottom surfaces of the first conductive portion and the second conductive portion of the first conductive feature. In some further embodiments, the first and second sidewalls of the first dielectric feature is free of the barrier layer.

In some embodiments, a thickness of the first dielectric feature is about 10% to about 90% of a thickness of the second conductive portion of the first conductive feature. In some embodiments, a width of the first dielectric feature is about 10% to about 90% of a total width of the first conductive portion and the second conductive portion of the first conductive feature. In some embodiments, a top surface of the second conductive portion of the first conductive feature contacts a bottom surface of a second conductive feature; and a top surface of the first dielectric feature contacts a bottom surface of a second dielectric feature disposed besides the second conductive feature. In some embodiments, the second conductive portion of the first conductive feature is away from the metal gate structure.

In some embodiments, the semiconductor device further comprises a spacer disposed between the first ILD layer and the metal gate structure, wherein a top surface of the spacer contacts at least one of a bottom surface of the first conductive portion of the first conductive feature and a bottom surface of the second conductive portion of the first conductive feature.

An exemplary method includes forming a semiconductor fin over a substrate; forming a metal gate structure over a channel region of the semiconductor fin; forming a first interlayer dielectric (ILD) layer over a source/drain (S/D) region next to the channel region of the semiconductor fin; forming a conductive feature on the metal gate structure and the first ILD layer; removing a top corner portion of the conductive feature to form an L-shape conductive feature, wherein the top corner portion is over at least a portion of the metal gate structure; and filling the top corner portion of the L-shape conductive feature with a first dielectric feature.

In some embodiments, the method further comprises forming a higher-level conductive feature contacting a top surface of the L-shape conductive feature; and a second dielectric feature contacting a top surface of the first dielectric feature.

In some embodiments, the method further comprises forming a second ILD layer over the metal gate structure and the first ILD layer before forming the conductive feature on the metal gate structure and the first ILD layer. In some further embodiments, the forming the conductive feature on the metal gate structure and the ILD layer includes forming a first trench through the second ILD layer to expose the metal gate structure; forming a second trench through the second ILD layer to expose the first ILD layer; depositing a conductive material over the first ILD layer and the metal gate structure in the first trench and the second trench; and planarizing the conductive material and the second ILD layer to form the conductive feature.

In some embodiments, the removing the top corner portion of the conductive feature to form the L-shape conductive feature includes forming a patterned photoresist layer over the conductive feature to expose the top corner portion of the conductive feature, wherein a width of the top corner portion is about 10% to about 90% of a width of the conductive feature; and etching the top corner portion of the conductive feature to form the L-shape conductive feature. In some embodiments, a depth of the top corner portion is about 5 nm to about 50 nm.

Another exemplary method includes forming a semiconductor fin over a substrate; forming a metal gate structure over a channel region of the semiconductor fin; forming a first interlayer dielectric (ILD) layer over a first source/drain (S/D) region next to the channel region of the semiconductor fin; forming a first conductive feature over the metal gate structure and the first ILD layer, wherein the first conductive feature includes a first conductive portion disposed on the metal gate structure and a second conductive portion disposed on the first ILD layer, wherein a top surface of the first conductive portion is below a top surface of the second conductive portion, a first sidewall of the first conductive portion contacts a lower portion of a first sidewall of the second conductive portion; and forming a dielectric feature on a top surface of the first conductive portion of the first conductive feature.

In some embodiments, the method further comprises forming a first hard mask over the metal gate structure; and forming a second hard mask over the ILD layer, wherein a material of the second hard mask is different from a material of the first hard mask.

In some embodiments, the forming the L-shape conductive feature includes forming a second ILD layer over the first hard mask and the second hard mask; forming a first slot in the second ILD layer to expose at least a portion of the first hard mask; removing the exposed portion of the first hard mask through the first slot to expose at least a portion of the metal gate structure; forming a second slot in the second ILD layer to expose at least a portion of the second hard mask; removing the exposed portion of the second hard mask through the second slot to expose at least a portion of the first ILD layer; depositing a first conductive material on the exposed portions of the first ILD layer and the metal gate structure through the first and the second slots; planarizing top portions of the first conductive material and the second ILD layer; and removing a top corner portion of the first conductive material to form the first conductive feature.

In some embodiments, the method further comprises forming a spacer between the metal gate structure and the first ILD layer, wherein forming the first and the second slots in the second ILD layer expose the spacer; removing a top portion of the space when removing the exposed portion of the fourth hard mask; and depositing the conductive material on the spacer.

In some embodiments, the method further comprises depositing a dielectric layer over the second ILD layer and the dielectric feature; patterning the dielectric layer to form openings, wherein the openings expose at least a portion of the first conductive feature; depositing a second conductive material in the openings; and removing a top portion of the second conductive material to form a second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a semiconductor fin over a substrate;
   forming a metal gate structure over a channel region of the semiconductor fin;
   forming a first interlayer dielectric (ILD) layer over a source/drain (S/D) region next to the channel region of the semiconductor fin;
   after forming the first ILD layer, forming a first hard mask layer directly on the metal gate structure;
   forming a second ILD layer over the metal gate structure and the first ILD layer;
   forming a first trench through the second ILD layer to expose the metal gate structure, wherein forming the first trench through the second ILD layer to expose the metal gate structure includes removing a first portion of the first hard mask layer;

forming a conductive feature in the first trench such that the conductive feature is disposed on the metal gate structure;

removing a top corner portion of the conductive feature to form an L-shape conductive feature, wherein the top corner portion is over at least a portion of the metal gate structure; and filling the top corner portion of the L-shape conductive feature with a first dielectric feature.

2. The method of claim 1, further comprising:
forming a higher-level conductive feature contacting a top surface of the L-shape conductive feature; and
a second dielectric feature contacting a top surface of the first dielectric feature.

3. The method of claim 1, wherein the forming the conductive feature in the first trench on the metal gate structure further includes:
forming a second trench through the second ILD layer to expose the first ILD layer;
depositing a conductive material over the first ILD layer and the metal gate structure in the first trench and the second trench; and
planarizing the conductive material and the second ILD layer to form the conductive feature.

4. The method of claim 1, wherein a second portion of the first hard mask layer interfaced with the conductive feature after the forming of the conductive feature in the first trench.

5. The method of claim 1, further comprising forming a source/drain feature on the semiconductor fin, the source/drain feature associated with the metal gate structure, and
wherein the L-shaped conductive feature is isolated from the source/drain feature by the first ILD layer after the removing of the top corner portion of the conductive feature to form the L-shape conductive feature.

6. A method of forming a semiconductor device, comprising:
forming a semiconductor fin over a substrate;
forming a metal gate structure over a channel region of the semiconductor fin;
forming a first interlayer dielectric (ILD) layer over a first source/drain (S/D) region next to the channel region of the semiconductor fin;
forming a first conductive feature over the metal gate structure and the first ILD layer, wherein the first conductive feature includes a first conductive portion disposed on the metal gate structure and a second conductive portion disposed on the first ILD layer, wherein a top surface of the first conductive portion is below a top surface of the second conductive portion, a first sidewall of the first conductive portion contacts a lower portion of a first sidewall of the second conductive portion;
forming a dielectric feature on a top surface of the first conductive portion of the first conductive feature;
forming a first hard mask over the metal gate structure, wherein a portion of the dielectric feature interfaces with the first hard mask after the forming of the dielectric feature; and
forming a second hard mask over the first ILD layer, wherein a material of the second hard mask is different from a material of the first hard mask.

7. The method of claim 6, wherein the forming of the first conductive feature over the metal gate structure and the first ILD layer includes:
forming a second ILD layer over the first hard mask and the second hard mask;
forming a first slot in the second ILD layer to expose at least a portion of the first hard mask;
removing the exposed portion of the first hard mask through the first slot to expose at least a portion of the metal gate structure;
forming a second slot in the second ILD layer to expose at least a portion of the second hard mask;
removing the exposed portion of the second hard mask through the second slot to expose at least a portion of the first ILD layer;
depositing a first conductive material on the exposed portions of the first ILD layer and the metal gate structure through the first and the second slots;
planarizing top portions of the first conductive material and the second ILD layer; and
removing a top corner portion of the first conductive material to form the first conductive feature.

8. The method of claim 7, further comprising:
forming a spacer between the metal gate structure and the first ILD layer, wherein forming the first and the second slots in the second ILD layer expose the spacer;
removing a top portion of the space when removing the exposed portion of the second hard mask; and
depositing the conductive material on the spacer.

9. The method of claim 7, further comprising:
depositing a dielectric layer over the second ILD layer and the dielectric feature;
patterning the dielectric layer to form openings, wherein the openings expose at least a portion of the first conductive feature;
depositing a second conductive material in the openings; and
removing a top portion of the second conductive material to form a second conductive feature.

10. A method comprising:
forming a semiconductor fin over a substrate;
forming a gate structure on the semiconductor fin;
forming a source/drain feature on the semiconductor fin, the source/drain feature associated with the gate structure;
forming an first interlayer dielectric layer over the substrate;
forming a conductive feature over the gate structure;
removing a portion of the conductive feature to form an L-shaped conductive feature, wherein the L-shaped conductive feature is isolated from the source/drain feature by the first interlayer dielectric layer; and
forming a first dielectric feature directly on the L-shaped conductive feature.

11. The method of claim 10, wherein the L-shaped conductive feature has a top surface that includes a first portion disposed at a first height above the substrate and a second portion disposed at a second height above the substrate that is different than the first height.

12. The method of claim 11, wherein after the forming of the first dielectric feature directly on the L-shaped conductive feature the first dielectric feature interfaces with the second portion of the top surface of the L-shaped conductive feature while the first portion of the top surface of the of the L-shaped conductive feature is free of the first dielectric feature.

13. The method of claim 12, further comprising forming a metal line directly on the first portion of the top surface of the L-shaped conductive feature.

14. The method of claim 10, further comprising forming a second interlayer dielectric layer over the substrate, and
   wherein the forming of the conductive feature over the gate structure further includes forming the conductive feature directly on a top surface of the second interlayer dielectric layer, the top surface of the second interlayer dielectric layer facing away from the substrate.

15. The method of claim 14, further comprising performing a planarization process on the second interlayer dielectric layer and the conductive feature prior to removing the portion of the conductive feature to form the L-shaped conductive feature.

16. The method of claim 10, further comprising:
   forming a sidewall spacer on the gate structure, wherein the sidewall spacer and the gate structure extend to the same height above the substrate after the forming of the sidewall spacer on the gate structure;
   recessing the gate structure such that the sidewall spacer extends to a greater height above the substrate than the recessed gate structure;
   recessing the sidewall spacer such that the recessed sidewall spacer extends to the same height above the substrate as the recessed gate structure, and
   wherein the forming of the sidewall spacer, the recessing of the gate structure and the recessing of the sidewall spacer occur prior to the forming of the conductive feature over the gate structure and the source/drain feature.

17. The method of claim 16, wherein the forming of the conductive feature over the gate structure includes forming the conductive feature directly on the recessed sidewall spacer and the recessed gate structure.

18. The method of claim 10, wherein the forming of the conductive feature over the gate structure further includes forming the conductive feature directly on the first interlayer dielectric layer covering the source/drain feature, wherein the first interlayer dielectric layer prevents the conductive feature from interfacing with the source/drain feature after the forming of the conductive feature directly on the first interlayer dielectric layer.

19. The method of claim 10, further comprising forming a sidewall spacer on the gate structure, and
   wherein forming the trench through the first interlayer dielectric layer to expose the gate structure further includes forming the trench through the first interlayer dielectric layer to expose the sidewall spacer.

20. The method of claim 19, further comprising recessing the exposed sidewall spacer prior to forming the conductive feature on the exposed gate structure within the trench and over the source/drain feature.

* * * * *